United States Patent
Flynn et al.

(10) Patent No.: US 10,108,755 B2
(45) Date of Patent: Oct. 23, 2018

(54) RF FLOOR PLAN BUILDING

(71) Applicant: Aerohive Networks, Inc., Milpitas, CA (US)

(72) Inventors: David Flynn, Portola Valley, CA (US); Chris Scheers, Palo Alto, CA (US)

(73) Assignee: Aerohive Networks, Inc., Milpitas, CA (US)

( * ) Notice: Subject to any disclaimer, the term of this patent is extended or adjusted under 35 U.S.C. 154(b) by 79 days.

(21) Appl. No.: 14/084,505

(22) Filed: Nov. 19, 2013

(65) Prior Publication Data
US 2015/0142391 A1    May 21, 2015

(51) Int. Cl.
*G06F 17/50*    (2006.01)
*H04W 16/20*    (2009.01)

(52) U.S. Cl.
CPC ........ *G06F 17/5004* (2013.01); *H04W 16/20* (2013.01)

(58) Field of Classification Search
CPC . H04W 16/18; H04W 16/20; G06F 17/30244; G06F 17/5004; G06T 15/04; G06T 17/05; G09B 29/005; G09B 29/007; Y10S 707/915; Y10S 707/921; Y10S 707/922; Y10S 707/955; Y10S 707/957; Y10S 707/959; Y10S 707/99942; Y10S 707/9994
USPC ....................................................... 703/2, 5
See application file for complete search history.

(56) References Cited

U.S. PATENT DOCUMENTS

| | | | |
|---|---|---|---|
| 7,873,238 B2 * | 1/2011 | Schultz et al. | 382/284 |
| 2007/0106717 A1 * | 5/2007 | Dundar et al. | 708/204 |
| 2008/0144968 A1 * | 6/2008 | Cohen | G06T 3/0018 382/276 |
| 2009/0132436 A1 * | 5/2009 | Pershing et al. | 705/400 |
| 2011/0096083 A1 * | 4/2011 | Schultz | 345/583 |
| 2013/0185024 A1 * | 7/2013 | Mahasenan et al. | 703/1 |

OTHER PUBLICATIONS

Churchill, S., Aerohive: Free Wi-Fi Planner, Dailywireless.org, Jun. 29, 2010, http://www.dailywirelss.org/2-1-/06/29/aerohive-free-wi-fi-planner.*
PRWweb, Aerohive Networks Releases New Version of Free Wi-Fi Planning Tool: PRWeb Online Visibility from Vocus, Jun. 29, 2010, http://www.prweb.com/releases/2010/06/prweb4202734.htm.*

(Continued)

*Primary Examiner* — Aniss Chad
*Assistant Examiner* — Brian S Cook
(74) *Attorney, Agent, or Firm* — Sheppard, Mullin, Richter & Hampton LLP

(57) ABSTRACT

Various implementations include systems and methods for generating a radio frequency floor plan. The systems and methods include receiving map data for a map image. A user is provided with functionalities for generating a trace outline in the map image. Floor dimensions are determined from the trace outline in the map image. A blank floor plan is generated using the floor dimensions and the map image. Access point position data can be received that signifies the position of placed access points. Access point type data can be received that signifies the type of access points that are positioned. The access point position data, the access point type data, and the floor plan or blank floor plan can be used to generate a RF floor plan.

7 Claims, 13 Drawing Sheets

(56) References Cited

OTHER PUBLICATIONS

Leopedrini, How to Run a RF Site Survey (Tips and Best Practices)—telecomHall, Jun. 20, 2011 http://www.telecomhall.com/hot-to-run-a-rf-site-survey-tips-and-best-practices.aspx.*
Farnoosh A., An Open Source RF Planner—Google Groups, Jan. 26, 2012, https://groups.google.com/forum/#!topic/google-map-api/CpA-QGPKae4.*
Cisco Wireless Control System Configuration Guide, Software Release 7.0, Cisco Systems, Inc., Jun. 2010.*
Aruba Networks Outdoor RF Coverage Planner Version 2.3, User Guide, Aruba networks Oct. 2011.*
Google Earth: Maps & Earth Street View: New Ground-Level View in Google Earch 6—Google Earth Blog, Nov. 29, 2010, http://www.gearthblog.com/blog/archives/2010/11/thoughts_on_google_earth_6.html.*
Agarwal, A., Measure Area of your Home or a Football Stadium with Google Maps, May 22, 2008 http://www.labnol.org/internet/tools/measure-area-home-football-stadium-with-google-maps/3373/.*
Theali, How to measure a building with Google Earth, YouTube, Nov. 23, 2011.*
AirTight Planning IEEE 802.11 Wireless Networks for Coverage and Security, AirTight Networks, Feb. 2005.*
VisualRF Users Guide 6.4, Aruba Networks, Inc. 2009.*
TuboCAD FORUM: Topic: Drawing outlines of large, existing buildings, Sep. 14, 2012 http://forums.turbocad.com/index.php?topic=9908.0.*
Levassar, Aerohive Free Wi-Fi Planning Tool Demo, Aerohive Networks, Oct. 4, 2011, YouTube https://www.youtube.com/watch?v=EaeMof5ltxg.*
Over Schmandt (GIS Commons: A Free eText about Geographic Information Systems, Jun. 12, 2012, http://web.archive.org/web/20130612005555/http://giscommons.org/introduction-concepts/).*
Sketchup_Jul. 21, 2013 SketchUp Knowledge Center, Tracing your Building footprint Jul. 21, 2013 http://help.sketchup.com/en/article/167476.*
Frye, C., Quick & Dirty Method & Tips for Creating Building Footprint Features, ArcGIS Blog Apr. 17, 2009 http://blogs.esri.com/esri/arcgis/2009/04/17/quick-dirty-method-tips-for-creating-building- . . . .*
Merz, S., Extracting Building Footprint from Raster, ArcGIS Desktop Discussion Forums Dec. 5, 2007 http://forums.esri.com/Thread.asp?c=93&f=993&t=240512.*
Zhou, Y., Using GIS to Map the WiFi Signal Strength: University of Nebraska—Lincoln, City Campus, Final Project Report, Dec. 10, 2012.*
Building_Terms_2009, Glossary of Square Footage Terms, Building Area Measurement LLC, Jan. 25, 2009 http://www.buildingareameasurement.com/glossary.htm.*
McCabe, C., How to use the Campus Editing Template, ArcGIS Resources Feb. 10, 2012 http://video.arcgis.com/watch/1017/how-to-use-the-campus-editing-template.*
ArcGIS_Map_Output_Formats, ArcGIS Help 10.1 http://resources.arcgis.com/en/help/main/10.1/index.html#//00sm00000004000000 Feb. 10, 2012.*
Sketchup_Jul. 21, 2013 (Sketchup Knowledge Center, Jul. 21, 2013 downloaded from http://web.archive.org/web/20130721233356/http://help.sketchup.com/en/article/167476).*
Schmandt (GIS Commons: A Free eText about Geographic Information Systems, Jun. 12, 2012, http://web.archive.org/web/20130612005555/http://giscommons.org/introduction-concepts/).*
Levassar (Aerohive Free Wi-Fi Planning Tool Demo, Oct. 4, 2011).*
AutoCAD_Tips_2011 (Area & Subtracting Areas, AutoCAD Tips: helpful tips for everyday users, Apr. 9, 2011 downloaded from https://autocadtips1.com/2011/04/09/area-subtracting-areas/).*
Madrigal (How Google Builds Its Maps—and What it Means for the Future of Everything, The Atlantic, Sep. 5, 2012).*

* cited by examiner

RF FLOOR PLAN BUILDING

BACKGROUND

As wireless technology has advanced more and more entities are providing wireless access to a network to users. Specifically, entities have begun to provide wireless access to users across through multiple access points. In particular, entities now integrate multiple access points on a floor of a buildings that allow a user to move around on the floor while still remaining connected to the network.

While entities now use multiple access points within a floor to provide access to a user, problems exist with planning access point placement to ensure that the user remains connected to the network as the user moves around the floor. Specifically, access point placement is critical in ensuring that adequate radio frequency coverage exists within areas of the floor to ensure that the user remains connected to the network through the access points. As a result, planning of access points placement and conducting a site survey of a floor in which access points are placed, is crucial in ensuring that a user remains connected to the network.

Through the providing of map services that provide map images to a user through a network, users are able to view map images including aerial, satellite, and street level views of buildings. While map images allow for ease in planning of access point placement and conducting site surveys, systems have not been integrated with map providers to allow for the planning of access point placement and the conduction of site surveys using map images that are both provided for by a map provider and a user. There therefore exists a need for systems and methods that allow for the integration of map images and functionalities for access point placement planning and site survey conduction.

Other limitations of the relevant art will become apparent to those of skill in the art upon a reading of the specification and a study of the drawings.

SUMMARY

The following implementations and aspects thereof are described and illustrated in conjunction with systems, tools, and methods that are meant to be exemplary and illustrative, not necessarily limiting in scope. In various implementations one or more of the above-described problems have been addressed, while other implementations are directed to other improvements.

Various implementations include systems and methods for generating a radio frequency floor plan. The systems and methods include receiving map data for a map image. In one example, a user is provided with functionalities for generating a trace outline in the map image. In another example, floor dimensions are determined from the trace outline in the map image. In still another example, blank floor plan is generated using the floor dimensions and the map image.

Various implementations also include providing functionalities to the user for positioning access points and selecting access point types within a blank floor plan or a floor plan. In one example, access point position data can be received that signifies the position of placed access points. In another example, access point type data can be received that signifies the type of access points that are positioned. In still another example, the access point position data, the access point type data, and the floor plan or blank floor plan can be used to generate a RF floor plan.

These and other advantages will become apparent to those skilled in the relevant art upon a reading of the following descriptions and a study of the several examples of the drawings.

DETAILED DESCRIPTION

Figure 1:
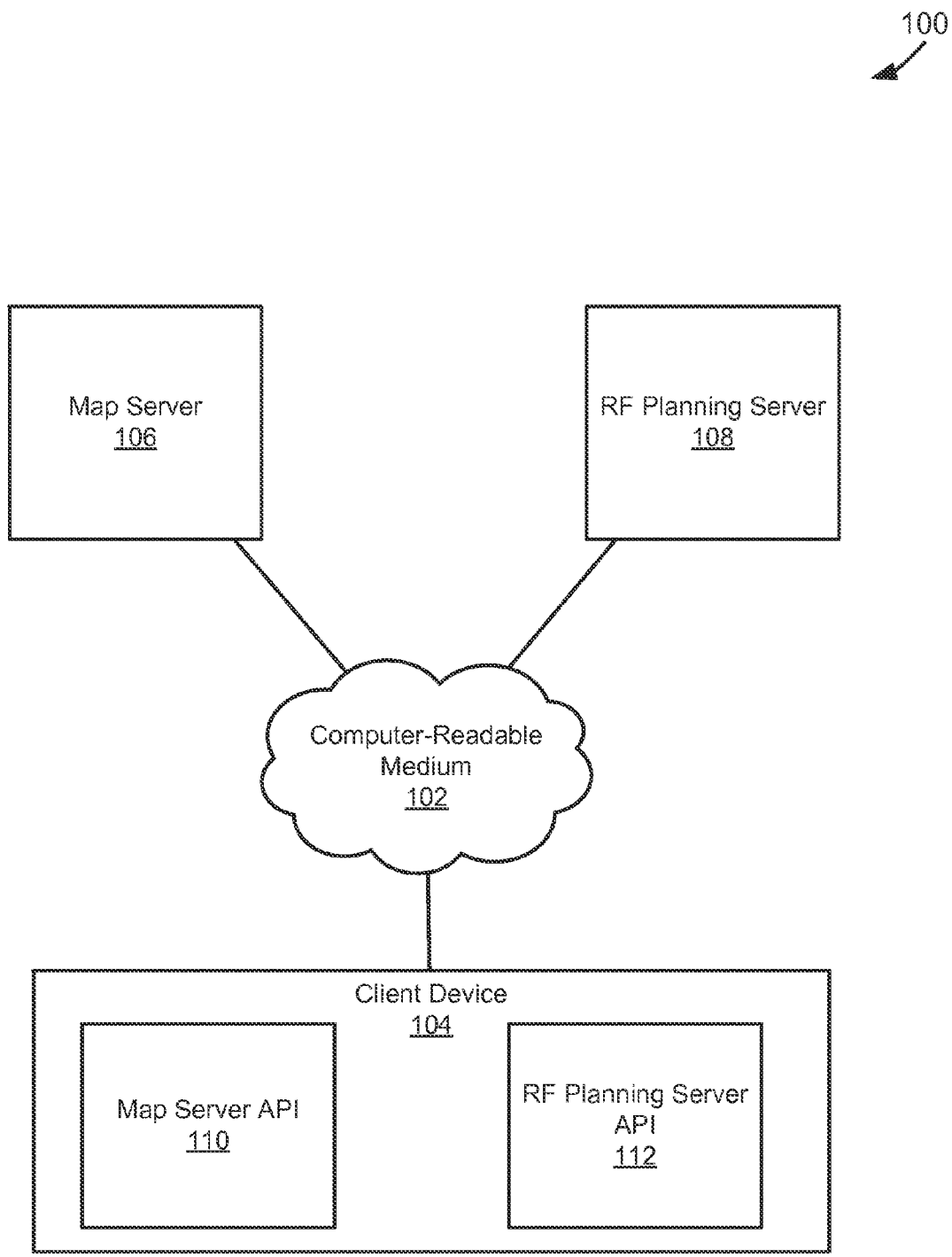
FIG. 1 depicts a diagram of an example of a system for radio frequency planning including a map server

FIG. 1 depicts a diagram 100 of an example of a system for radio frequency (hereinafter referred to as "RF") planning including a map server. The system of the example of FIG. 1 includes a computer-readable medium 102, a client device 104, a map server 106, and an RF planning server 108.

The client device 104, the map server 106, and the RF planning server 108 are coupled to each other through computer readable medium 102. As used in this paper, a "computer-readable medium" is intended to include all mediums that are statutory (e.g., in the United States, under 35 U.S.C. 101), and to specifically exclude all mediums that are non-statutory in nature to the extent that the exclusion is necessary for a claim that includes the computer-readable medium to be valid. Known statutory computer-readable mediums include hardware (e.g., registers, random access memory (RAM), non-volatile (NV) storage, to name a few), but may or may not be limited to hardware.

The computer-readable medium 102 is intended to represent a variety of potentially applicable technologies. For example, the computer-readable medium 102 can be used to form a network or part of a network. Where two components are co-located on a device, the computer-readable medium 102 can include a bus or other data conduit or plane. Where a first component is co-located on one device and a second component is located on a different device, the computer-readable medium 102 can include a wireless or wired back-end network or LAN. The computer-readable medium 102 can also encompass a relevant portion of a WAN or other network, if applicable.

The computer-readable medium 102, the client device 104, the map server 106, the RF planning server 106, and applicable systems, engines, or devices described in this paper can be implemented as a computer system or parts of a computer system or a plurality of computer systems. A computer system, as used in this paper, is intended to be construed broadly. In general, a computer system will include a processor, memory, non-volatile storage, and an interface. A typical computer system will usually include at least a processor, memory, and a device (e.g., a bus) coupling the memory to the processor. The processor can be, for example, a general-purpose central processing unit (CPU), such as a microprocessor, or a special-purpose processor, such as a microcontroller.

The memory can include, by way of example but not limitation, random access memory (RAM), such as dynamic RAM (DRAM) and static RAM (SRAM). The memory can be local, remote, or distributed. The bus can also couple the processor to non-volatile storage. The non-volatile storage is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software on the computer system. The non-volatile storage can be local, remote, or distributed. The non-volatile storage is optional because systems can be created with all applicable data available in memory.

Software is typically stored in the non-volatile storage. Indeed, for large programs, it may not even be possible to store the entire program in the memory. Nevertheless, it should be understood that for software to run, if necessary, it is moved to a computer-readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at an applicable known or convenient location (from non-volatile storage to hardware registers) when the software program is referred to as "implemented in a computer-readable storage medium." A processor is considered to be "configured to execute a program" when at least one value associated with the program is stored in a register readable by the processor.

In one example of operation, a computer system can be controlled by operating system software, which is a software program that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system is typically stored in the non-volatile storage and causes the processor to execute the various acts required by the operating system to input and output data and to store data in the memory, including storing files on the non-volatile storage.

The bus can also couple the processor to the interface. The interface can include one or more input and/or output (I/O) devices. The I/O devices can include, by way of example but not limitation, a keyboard, a mouse or other pointing device, disk drives, printers, a scanner, and other I/O devices, including a display device. The display device can include, by way of example but not limitation, a cathode ray tube (CRT), liquid crystal display (LCD), or some other applicable known or convenient display device. The interface can include one or more of a modem or network interface. It will be appreciated that a modem or network interface can be considered to be part of the computer system. The interface can include an analog modem, isdn modem, cable modem, token ring interface, satellite transmission interface (e.g. "direct PC"), or other interfaces for coupling a computer system to other computer systems. Interfaces enable computer systems and other devices to be coupled together in a network.

The computer systems can be compatible with or implemented as part of or through a cloud-based computing system. As used in this paper, a cloud-based computing system is a system that provides virtualized computing resources, software and/or information to client devices. The computing resources, software and/or information can be virtualized by maintaining centralized services and resources that the edge devices can access over a communication interface, such as a network. "Cloud" may be a marketing term and for the purposes of this paper can include any of the networks described herein. The cloud-based computing system can involve a subscription for services or use a utility pricing model. Users can access the protocols of the cloud-based computing system through a web browser or other container application located on their client device.

A computer system can be implemented as an engine, as part of an engine or through multiple engines. As used in this paper, an engine includes at least two components: 1) a dedicated or shared processor and 2) hardware, firmware, and/or software modules that are executed by the processor. Depending upon implementation-specific or other considerations, an engine can be centralized or its functionality distributed. An engine can include special purpose hardware, firmware, or software embodied in a computer-readable medium for execution by the processor. The processor transforms data into new data using implemented data structures and methods, such as is described with reference to the FIGS. in this paper.

Applicable engines described in this paper, or the engines through which the systems and devices described in this paper can be implemented, can be cloud-based engines. As used in this paper, a cloud-based engine is an engine that can run applications and/or functionalities using a cloud-based computing system. All or portions of the applications and/or functionalities can be distributed across multiple computing devices, and need not be restricted to only one computing device. In some embodiments, the cloud-based engines can execute functionalities and/or modules that end users access through a web browser or container application without having the functionalities and/or modules installed locally on the end-users' computing devices.

As used in this paper, datastores are intended to include repositories having any applicable organization of data, including tables, comma-separated values (CSV) files, traditional databases (e.g., SQL), or other applicable known or convenient organizational formats. Datastores can be implemented, for example, as software embodied in a physical computer-readable medium on a general- or specific-purpose machine, in firmware, in hardware, in a combination thereof, or in an applicable known or convenient device or system. Datastore-associated components, such as database interfaces, can be considered "part of" a datastore, part of some other system component, or a combination thereof, though the physical location and other characteristics of datastore-associated components is not critical for an understanding of the techniques described in this paper.

Datastores can include data structures. As used in this paper, a data structure is associated with a particular way of storing and organizing data in a computer so that it can be used efficiently within a given context. Data structures are generally based on the ability of a computer to fetch and store data at any place in its memory, specified by an address, a bit string that can be itself stored in memory and manipulated by the program. Thus, some data structures are based on computing the addresses of data items with arithmetic operations; while other data structures are based on storing addresses of data items within the structure itself. Many data structures use both principles, sometimes combined in non-trivial ways. The implementation of a data structure usually entails writing a set of procedures that create and manipulate instances of that structure. The datastores, described in this paper, can be cloud-based datastores. A cloud-based datastore is a datastore that is compatible with cloud-based computing systems and engines.

In a specific implementation, the client device 104 is a device through which a client or user of the client device 104 can receive and/or generate data. In the specific implementation, a user of the client device 104 can generate data through a data input system that is either or both integrated as part of the client device 104 or coupled to the client device 104. In one example, the client device 104 is a thin client device or an ultra-thin client device. The client device 104 can include a wireless network interface, through which the client device 104 can receive data wirelessly through a wireless communication channel formed as part of the computer-readable medium 102. The wireless network interface can be used to send data generated by the client device 104 to remote or local systems, servers, engines, or datastores through a wireless communication channel formed as part of the computer-readable medium 102. In a specific example, the wireless communication channel is a cellular communication channel. In another specific example, the client device 104 is 802.11 standards-compatible or 802.11 standards-compliant.

In a specific implementation, the client device 104 includes a graphical user interface through which a user of the client device 104 views and/or interacts with data received from the map server 106 and/or the RF planning server 108. Further in the specific implementation, a user of the client device 104 can generate data through the graphical user interface. In one example, the graphical user interface of the client device 104 displays and/or allows a user to interact with data received from the map server 106. In another example, the graphical user interface of the client device 104 displays and/or allows a user to interact with data received from the RF planning server 108.

In a specific implementation, the map server 106, functions to provide a web based mapping service application to a user of the client device 104. In the specific implementation, the map server 106 provides map images of locations on Earth to a user of the client device 106. In one example, the map server 106 provides map images to the user of client device 106 at varying zoom levels with respect to a specific location. In another example of the specific implementation, the map server 106 provides map images of either aerial or satellite views, at varying zoom levels of a specific location to the user of a client device 106. In still another example of the specific implementation, the map server 106 provides a map image of an aerial or satellite view of a building that is a 3-D representation of the building. In yet another example of the specific implementation, the map server 106 provides map images of street level views at a specific location. The street level view, as is used in this paper, is the perspective a user would have if the user was at the specific location. In another example, the map images of street level views can be stitched to form a panoramic view at the specific location. The map server 106 can be implemented as part of an applicable map image provider, including but not limited to Google® Maps, Yahoo® Maps, Bing® Maps, and MapQuest®.

In a specific implementation, the map server 106 provides map data, including map images, to the client device 104. In one example, the map data includes a reference point for a map image. Further in the one example, the reference point can be the center of the map image. In another example, the map data includes map image data, such as pixel array and pixel color and intensity, which is used to render the map image on a graphical user interface of the client device 104. In yet another example, the map data includes geographical coordinates for any number of points and/or pixels in the map image. For example, the geographical coordinates can include longitude and latitude coordinates. In still another example, the map data includes the zoom level for a map image.

In a specific implementation the RF planning server provides functionalities to a user of the client device 104 in planning RF access point (hereinafter referred to as "AP") placement. In one example, an AP is referred to as a device that creates a wireless communication channel in compliance with the IEEE 802.11 standard. IEEE 802.11a-1999, IEEE 802.11b-1999, IEEE 802.11g-2003, IEEE 802.11-2007, and IEEE 802.11n TGn Draft 8.0 (2009) are incorporated by reference. As used in this paper, a system or device that is 802.11 standards-compatible or 802.11 standards-compliant complies with at least some of one or more of the incorporated documents' requirements and/or recommendations, or requirements and/or recommendations from earlier drafts of the documents, and includes Wi-Fi systems. Wi-Fi is a non-technical description that is generally correlated with the IEEE 802.11 standards, as well as Wi-Fi Protected Access (WPA) and WPA2 security standards, and the Extensible Authentication Protocol (EAP) standard. In alternative embodiments, an AP may comply with a different standard other than Wi-Fi or IEEE 802.11, may be referred to as something other than an "access point," and may have different interfaces to a wireless or other medium.

IEEE 802.3 is a working group and a collection of IEEE standards produced by the working group defining the physical layer and data link layer's MAC of wired Ethernet. This is generally a local area network technology with some wide area network applications. Physical connections are typically made between nodes and/or infrastructure devices (hubs, switches, routers) by various types of copper or fiber cable. IEEE 802.3 is a technology that supports the IEEE 802.1 network architecture. As is well-known in the relevant art, IEEE 802.11 is a working group and collection of standards for implementing wireless local area network (WLAN) computer communication in the 2.4, 3.6 and 5 GHz frequency bands. The base version of the standard IEEE 802.11-2007 has had subsequent amendments. These standards provide the basis for wireless network products using the Wi-Fi brand. IEEE 802.1 and 802.3 are incorporated by reference.

In a specific implementation, the RF planning server 108 uses map data obtained from the map server 106 to provide functionalities to a user of the client device 104 in AP placement and planning. In one example, the RF planning server 108 provides functionalities in generating a floor plan based on floor dimensions data of floors. In an example, the floor dimensions include the outline of the footprint of a floor and/or the height or heights of a floor. In another example, the floor dimensions include the orientation of the floor, including the outline of the footprint of the floor with respect to cardinal directions, e.g. north, south, east and west. Further in the one example, the floor dimensions data can be generated based on map data. In still another example, the RF planning server 108 provides functionalities for adding obstructions (e.g. walls, both interior and exterior) into a floor plan using the floor dimensions generated, at least in part, from the map data. In another example, the RF planning server provides functionalities for placing APs within the floor plan to generate a RF floor plan. The RF floor plan includes the floor plan and the positioning of APs within the floor plan.

In a specific implementation, the RF planning server 108 provides functionalities that allow a user of the client device 104 to simulate RF coverage based on a simulated placement of APs in a floor plan. In one example, the simulated placement of the APs in the floor plan is determined by the user of the client device 104. Further in the example, the simulated placement of the APs can be based, at least in part on a floor plan generated, at least in part, from map data. In another example, the simulated RF coverage is based on both the simulated placement of the APs in the floor and also the type of APs and the operational parameters of the APs. Further in another example, the operational parameters of the APs can be based on whether the APs are located in a high density area, where a large number of client devices will connect to the APs. In one example, the simulated RF coverage and/or simulated AP placement is included as part of RF plan data.

In a specific implementation, the RF planning server 108 provides functionalities to a user of the client device 104 in generating a site survey of an existing RF floor plan. In one example of the specific implementation, the RF planning server 108 provides functionalities in generating a site survey based on actual placement of APs within the site. Further in the one example, the RF planning server 108 can provide functionalities in generating a site survey by using map data provided by the map server 106. In one example, the RF planning server 108 uses signal strength data collected form the client device to determine RF coverage of the APs of the site in forming the site survey. Further in the one example, the RF panning server 108 can use the signal strength data along with density data to determine RF coverage of the APs of the site in forming the site survey. The density data can include the minimum and maximum number of client devices that have connected to or are expected to connect to the APs at a given time. In yet another example, the site survey is included as part of RF plan data.

The client device 104 includes a map server application programming interface 110 (hereinafter referred to as "map server API") and a RF planning server application programming interface 112 (hereinafter referred to as "RF planning server API"). In a specific implementation the map server API 110 and the RF planning server API 112 can function to allow a user of the client device 104 to interact with the map server 106 and the RF planning server 108. In one example, either or both the map server API 112 and the RF planning server API 112 are implemented as JavaScript based application programming interfaces.

In a specific implementation, a user of the client device 104 controls what map data is received form the map server 106 through the map server API 110. In one example, the user of the client device 104 can request, through the map server API 110, to zoom into a map image that the user is viewing. As a result, the map server 106 can return to the client device 104 map data, including a map image that is at the requested zoom level. In another example, the user of the client device 104 can request, through the map server API 110, a map image of a street level view at a specific location in a map. As a result, the map server 106 can return to the client device the requested map image of a street level view to the user of the client device 104.

In a specific implementation, a user of the client device 104 controls and utilizes the functionalities provided by the RF planning server 108 through the RF planning server API 112. In one example, a user of the client device 104 can create floor dimensions through the RF planning server API 112. Further in the one example, the user of the client device 104 can create floor dimensions using map image data obtained from the map server 106, through the map server API 110. In another example, a user of the client device 104 can conduct a site survey through the RF planning server API 112. In yet another example, a user of the client device 104 can simulate AP placement and/or AP coverage through the RF planning server API 112.

Figure 2:
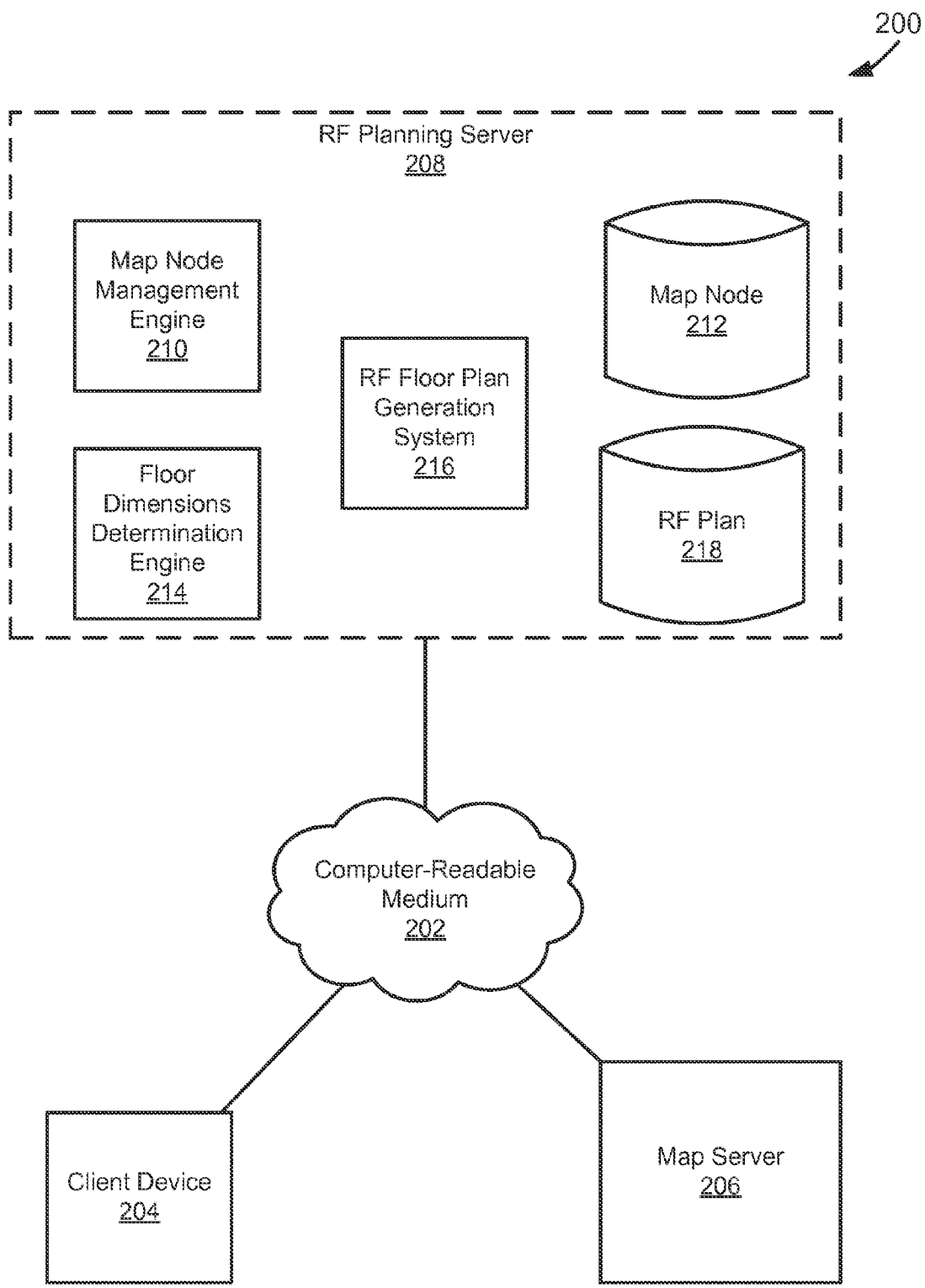
FIG. 2 depicts a diagram of an example of a system for generating map image nodes and floor dimensions.

FIG. 2 depicts a diagram 200 of an example of a system for generating map image nodes and floor dimensions. The system in FIG. 2 includes a computer-readable medium 202, a client device 204, a map server 206, and a RF planning server 208. The client device 204, the map server 206, and the RF planning server 208 are coupled to each other through the computer-readable medium 202.

In a specific implementation, the client device 204 functions according to an applicable device that is capable of receiving and/or generating data, such as the client devices described in this paper. In another specific implementation, the map server 206 functions according to an applicable map image provider, such as the map servers described in this paper. In yet another specific implementation, the RF planning server 208 functions according to an applicable RF planning system, such as the RF planning servers described in this paper.

The RF planning server 208 includes a map node management engine, a map node datastore 212, a floor dimensions determination engine 214, a RF floor plan generation system 216, and a RF plan datastore 218.

In a specific implementation, the map node management engine 210 functions to generate map nodes for map images viewed by a user of the client device 204. In one example, each map node represents a specific map image for a user of the client device 204. Further in the one example, the map nodes are used by a user of the client device to view the represented map image on the client device 204 from which floor dimension, as will be discussed later, are generated. For example, a user can select a map node, and the map data of the map image that is represented by the map node can be sent from the map server 206 to the client device 204, where the map image can be rendered in a graphical user interface. In an example, each map node includes map data for the specific map image that the map node represents. In another example, the map node includes the longitude and latitude coordinates of a point within a specific map image. In yet another example, the map node includes the longitude and latitude coordinates of a reference point within a specific map image that the map node represents. Further in the yet another example, the reference point is the center of the specific map image that the map node represents. In still another example, the map node includes the zoom level of the specific map image. In an even further example, each node includes the orientation of the specific map image that the map node represents. In the even further example, when a user selects the map node, the map image can be rendered in a graphical user interface of the client device based on the specific orientation of the map image included as part of the map node.

In a specific implementation, the map node management engine 210 generates organizational nodes. In one example, the organizational node uniquely represents a specific user of the client device 204. In another example, the organizational node uniquely represents an entity association with the user of the client device 204. For example, if a user of the device 204 is an employee of Company A, then the organizational node can represent Company A. In yet another example, the organizational node uniquely represents a building with a floor or a specific floor for which a floor plan is created or floor dimensions are calculated. The organizational node can include the address of the building, the name of the entity, the list of contacts at the entity, and/or the name of a user, that the organizational node represents.

In a specific implementation, in generating nodes, the map node management engine 210 retrieves map data that is used to form part of the map nodes from the client device 204. In one example, the map data, retrieved from the client device 204 by the map node management engine 210, is sent to the client device 204 from the map server 206. In a specific example, the map node management engine 210 creates a node when a user of the client device 204 first views a map image during a session. In another example, the map node management engine 210 retrieves map data to create map nodes each time that the client device views a new map image at a different zoom level than the previously viewed map image in the session. For example, if a user views a first map image at a zoom level of 10% and then views a second map image at a zoom level of 20%, then the map node management engine 210 can create a map node using the map data of the second map image at the zoom level of 20%. In yet another example, the map node management engine 210 creates a map node when instructions are received from the user of the client device 204 to create a node. For example, the user of the client device 204 can receive different map images at the same zoom level. The user of the client device 204 can select the desired map image and instruct the map node management engine 210 to create a map node that represents the desired map image. In yet another specific example, the building for which the user is creating floor dimensions, is centered in the map image represented by the map node.

In a specific implementation, the map node management engine 210 functions to generate a hierarchy of map nodes using the organizational nodes and the map nodes. In one example, the hierarchy of map nodes is uniquely associated with a client device 204, a user of the client device 204, or an organization associated with the user of the client device 204. For example, if a user of the client device 204 is an employee of Company A, then the hierarchy of map nodes generated for the user of the client device 204 can be uniquely associated with Company A. In another example, the hierarchy of map nodes is uniquely associated with a building or a floor of a building for which the floor dimensions were created or are being created. In yet another example, multiple users are granted access to the hierarchy of map nodes. For example, if a hierarchy of map nodes is generated based on the interaction of user A of the client device 204 with the RF planning server 208, and user A is associated with Company A, then a specific number of employees of Company A can be granted the right to access and collaborate on the generated hierarchy of map nodes. Further in the example, the employees granted the right to access the hierarchy of map nodes can access the hierarchy of map nodes and collaborate on the creation of the hierarchy of map nodes from a separate client device that is coupled to the RF planning server 208 as the hierarchy of map nodes is created.

In a specific implementation, the map node management engine 210 generates a hierarchy of map nodes according to an organization manner. In one example, the organization manner includes, at least in part, organizing the map nodes based on the zoom level of the map images that the map nodes represent. In another example, the organization manner includes, at least in part, organizing the map nodes according to the regions covered by the map image. For example, if the first and second map nodes represent map images that are at least in part, in city A, and a third map node represents a map image of the entire city A, then the map node management engine 210 can organize the first and second map nodes in a hierarchy under the third map image.

In a specific implementation, the map node management engine 210 generates a hierarchy of map nodes using, at least in part, an organization manner based one or a plurality of organizational nodes. In one example, the organization manner includes, at least in part, organizing the map nodes according to the user of the client device 204 or the entity associated with the client device 204 for which the map nodes are created as the user of the client device 204 interacts with the RF planning server 208. For example, if a user of the client device 204 is associated with Company A, then map nodes created as the user of the client device 204 interacts with the system can be organized in a hierarchy underneath an organizational node that represents Company A. In still another example, the organization manner includes, at least in part organizing the map nodes according to the building or floor for which the floor plan is created. For example, the map nodes generated as the user of the client device 204 creates a floor plan for the second floor of building A can be organized in a hierarchy underneath an organizational node that represents either or both building A or the second floor of building A. In a further example, a combination of applicable previously described organization manners are used to generate a hierarchy of map nodes.

In a specific implementation, the hierarchy of map nodes, including the organizational nodes and the map nodes, are stored as map node hierarchy data in the map node datastore 212. In one example the hierarchy of map nodes, stored as part of map node hierarchy data, includes map nodes organized in a hierarchical fashion according to applicable previously described organizational manners. In yet another example, the map nodes, stored as part of map node hierarchy data, includes applicable previously described map data that is used to form the map node. In a specific example of the yet another example, the map data includes the longitude and latitude coordinates of a point within a specific map image represented by the map node. In a further example of the yet another example, the map data includes the longitude and latitude coordinates of a reference point within a specific map image represented by the map node. In still a further example of the yet another example, the map data includes the zoom level of the specific map image represented by the map node. In another example, the map node hierarchy data includes an identification of the floor plan of which a node, a plurality of nodes, or a hierarchy of nodes is associated.

In a specific implementation, the floor dimensions determination engine 214 functions to generate floor dimensions for a floor of a building. In one example, the floor dimensions determination engine 214 generates the floor dimensions based on map data of one or a plurality of map images. In an example of the one example, the floor dimensions determination engine 214 generates floor dimensions of a specific map image represented by a map node. In another example of the one example, the floor dimensions determination engine 214 generates floor dimensions, at least in part, based on map data received through the client device 204, from the map server 206. In yet another example of the one example, the floor dimensions determination engine 214 generates floor dimensions, at least in part, based on map data included as a map node as part of the map node hierarchy data stored in the map node datastore 212. In a further example, the floor dimensions determination engine 214 generates floor dimensions, at least in part, based on information contained within the organizational nodes as part of the map node hierarchy data stored in the map node datastore 212. In still another example of the one example, the floor dimensions determination engine 214 generates floor dimensions, at least in part, based on input generated by a user of the client device 204 and received from the client device 204.

In a specific implementation, in generating floor dimensions, the floor dimensions determination engine 214 provides a user of the client device 204 with functionalities for generating input used to determine floor dimensions. In one example, the floor dimension determination engine 214 provides a floor cursor tool that can be used by the user of the client device 204 to trace an outline of a floor. Further in the one example, the floor cursor tool can be used with a display of a map image rendered onto a graphical user interface of the client device 204. In one example, the user of the client device 204 can view a building from an aerial or satellite view through the map image and create a trace outline of a floor using the floor cursor tool. In a specific example of the one example, the user of the client device 204 can view a 3-D representation of the building from an aerial or satellite view and create trace outlines of multiple floors of a building. In a specific example, the multiple floors for which the trace outlines are created have different floor dimensions. In another specific example of the one example, the user of the client device 204 can create trace outlines of floors in different buildings in the same map image that are then used to calculate floor dimensions of the respective floors in the different buildings. In another example, the floor cursor tool includes a line drawing tool that allows a user to create trace lines that form the trace outline of the floor. In yet another example, the floor cursor tool includes a shape tool that allows a user to create shapes, the sides of which form, at least in part, the trace lines that form the trace outline of the floor. Further in the yet another example, the shape tool allows a user to create shapes of varying sizes and type in forming, at least in part, the trace outline of the floor.

In a specific implementation, the trace outline of the floor includes a number of trace lines. In one example of generating the trace outline of the floor, the user of the client device 204 can form two trace lines that do not intersect. In another example, a shape that is formed by a first trace line is nested within an outer shape that is formed by a second trace line. For example, if the building has a courtyard in the center, the user can trace along the outer sides of the building and the inner sides of the building that form the courtyard to create the first trace line, the second trace line, and the resulting inner and outer shapes.

In a specific implementation, the floor dimensions determination engine 214 uses the trace outline of the floor to generate floor dimensions in a physical space or an estimate of floor dimensions in a physical space of a floor of a building. The floor dimensions of a floor of building can include the area in the physical space of the footprint of the floor of the building. The floor dimensions can also include the lengths of the sides of the building in the physical space that make up the footprint of the floor of the building. In one example, the floor dimensions determination engine 214 uses the geographical coordinates of points in the map image from which the trace outline of the floor was created to determine the floor dimensions. In an example of the one example, the geographical coordinates are included as part of or are generated from the map data obtained from the map server 206. In another example, the floor dimensions determination engine 214 uses the zoom level of the map image, from which the trace outline of the floor was created, to determine the floor dimensions. In one example of the another example, the floor dimensions determination engine 214 uses the zoom level to determine the actual distance in the physical space represented by two adjacent pixels in the map image. Further in the one example, the floor dimensions determination engine 214 uses the determined actual distance in the physical space and the number of pixels in the trace lines that form the trace outline of the floor to determine the floor dimensions.

In a specific implementation, the floor dimensions determination engine 214 can calculate floor dimensions by using nesting functions. In one example, the nesting functions specify what nested shapes in the trace outline of the floor to subtract or add in calculating the floor dimensions. In an example of the one example, the nesting functions specify to subtract shapes nested within an outer shape in calculating floor dimensions. For example, if a building includes a courtyard, the trace outline can include a first trace line formed along the outer sides of a building forming a first shape and a second trace line formed around the inner sides of the building that forms a second shape nested within the first shape representing the courtyard. In the example, the floor dimensions determination engine 214 subtracts the area of the second shape from the area of the first shape, according to nesting functions, in determining the floor dimensions.

In a specific implementation, the nesting functions, used by the floor dimensions determination engine 214 in determining floor dimensions, specify to subtract the area created by a second shape nested within a first shape, and add the area created by a third shape nested within the second shape. For example, if a building includes an inner building space region and an outer building space region separated by a courtyard surrounding the inner building space region, the trace outline of the floor includes a first shape created by a first trace line formed along the outer sides of the outer building space region, a second shape created by a second trace line formed along the inner sides of the outer building space region, and a third shape created by a third trace line formed along the outer sides of the inner building space region. In the example, the floor dimensions determination engine 214, can calculate the floor dimensions, according to the nesting functions of the specific implementation, to subtract the area of the second shape from the area of the first shape and add the area of the third shape to the area of the first shape. As a result, the floor dimensions include the area of the outer and inner building spaces, and exclude the area of the courtyard. In another example, the nesting functions specifying the subtracting and adding of areas created by nested shapes can be extended to apply to more than three nested shapes created in the trace outline of the floor.

In a specific implementation, RF plan data is stored in the RF plan datastore 218. In one example, the RF plan data includes floor dimensions generated by the floor dimensions determination engine 214. In another example, the RF plan data includes floor dimensions generated by the floor dimensions determination engine 214 based, at least in part, from map data received from the map server 206.

In a specific implementation, the RF floor plan generation system 216 provides functionalities to a user for generating a RF floor plan using floor dimensions stored in the RF plan datastore 214. In an example, the RF floor plan generation system 216 can function according to an applicable floor plan generation system, such as the RF floor plan generation systems described in this paper. In one example, the RF floor plan generation system 216 generates a floor plan form the floor dimensions included as part of the RF plan data stored in the RF plan datastore 214. Further in the one example, the floor plan includes the exterior walls of the floor, as determined from the floor dimensions. In another example, the RF floor plan generation system 216 presents the floor plan to the user of the client device 204. In yet another example, the RF floor plan generation system 216 provides functionalities to the user that allow the user to add obstructions to the floor plan in creating the RF floor plan. In yet another example, the RF floor plan generation system 216 provides functionalities to the user that allow the user to place APs in the floor plan, thereby creating the RF floor plan.

In a specific implementation, the RF floor plan generation system 216 simulates RF coverage of the RF floor plan. In one example, the RF floor plan generation system 216 simulates RF coverage based, at least in part, on the placement of APs in the floor plan and the obstructions in the floor plan. Further in the one example, the user can change the RF floor plan by modifying the placement of either or both the APs and obstructions in the floor plan based on the simulated RF coverage for the RF floor plan.

In an example of operation of the system shown in FIG. 2, a user of the client device 204 receives map data from the map server 206. Further in the example of operation, the RF planning server 208 provides functionalities to a user of the client device 204 for generating a RF floor plan. In the example of operation, the RF planning server 208 provides functionalities to a user of the client device 204 for generating a RF floor plan based on the map data received from the map server 206. In the example of operation, the map node management engine generates a hierarchy of nodes. The nodes can include map nodes that are generated based on the map data and organizational nodes. In one example, the nodes are used by a user to view a map image represented by a map node on the client device 204 from map data obtained from the map server 206. Further in the example of operation of the system shown in FIG. 2, the floor dimensions determination engine 214 provides functionalities to a user for generating floor dimensions from the map data of a map image received from the map server 206. The generated floor dimensions are saved in the RF plan datastore 218 and used by the RF floor plan generation system 216 to provide functionalities in generating both a floor plan and a RF floor plan.

Figure 3:
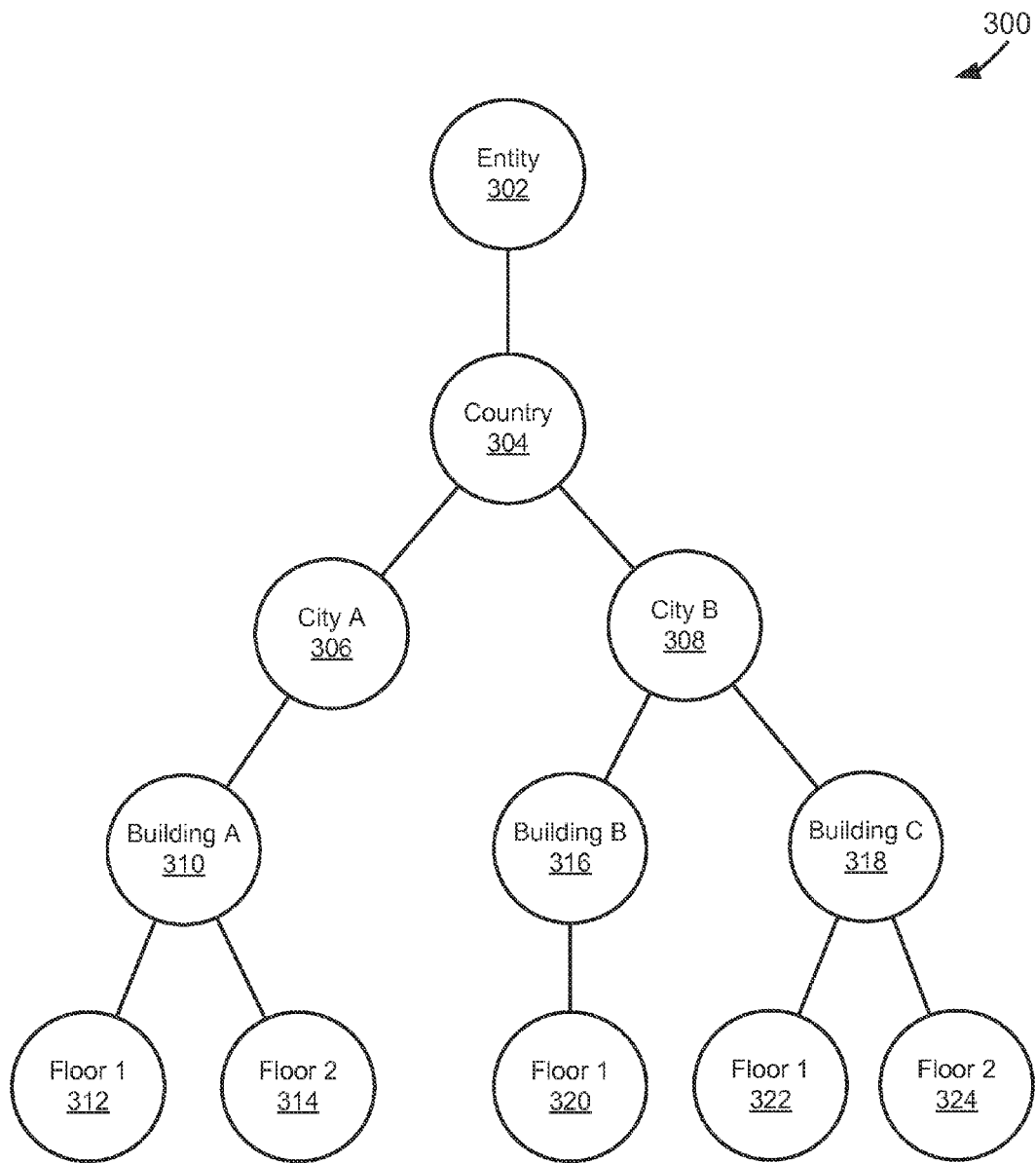
FIG. 3 depicts a diagram of an example of a hierarchy of map nodes.

FIG. 3 depicts a diagram 300 of an example of a hierarchy of map nodes. In a specific implementation the hierarchy of map nodes is created by a map node management engine. The example hierarchy of map nodes shown in FIG. 3 includes both organizational nodes and map nodes.

In the example of FIG. 3, the hierarchy of map nodes includes a top organizational node 302. Further in the example, the top organizational node represents an entity. In one example, the entity is a company or an organization for which a RF floor plan is created. Underneath the top organizational node is a country node 304. In one example, the country node 304 is an organizational node that represents a specific country in which buildings or floors of buildings are located for which RF floor plans are created. In another example, the country node 304 is a map node that represents a map image of a specific country in which buildings or floors of buildings of the client are located for which RF floor plans are created. In the examples, the buildings or floors of buildings, for which the RF floor plans are created, are associated with the entity represented by the top organizational node 302 and therefore the country node 304 is organized beneath the top organizational node 302.

In the example of FIG. 3, the hierarchy of map nodes includes city node A 306 and city node B 308. In one example, either or both city node A 306 and city node B 308 are organizational nodes representing different cities in which buildings or floors of buildings are located for which RF floor plans are created. In another example, either or both city node A 306 and city node B 308 are map nodes that represent map images of corresponding different cities in which buildings or floors of buildings are located for which RF floor plans are created. In the examples, the buildings or floors of buildings, for which the RF floor plans are created, are associated with the entity represented by the top organizational node 302 and therefore the city node A 306 and city node B 308 is organized beneath the top organizational node 302. Further in the examples, the cities represented by city node A 306 and city node B 308 are located in the country represented by country node 304. As a result, the city node A 306 and the city node B 308 are organized beneath the country node 304 in the example hierarchy of map nodes shown in FIG. 3.

In the example of FIG. 3, the hierarchy of map nodes includes building A node 310. In one example, building A node 310 is an organizational node that represents building A in which floors are located for which RF floor plans are created. In another example, building A node 310 is a map node that represents a map image of building A in which floors are located for which RF floor plans are created. In the example, building A is located in city A, and therefore the building A node 310 is organized beneath the city A node 306. Further in the example of FIG. 3, the hierarchy of map nodes includes floor 1 node 312 and floor 2 node 314. In one example, floor 1 node 312 and floor 2 node 314 are map nodes that represent one or a plurality of map images of floors 1 and 2 in building A. Further in the example, floor 1 and floor 2 are located within building A. As a result, floor 1 node 312 and floor 2 node 314 are organized beneath the buildings A node 310 in the hierarchy of map nodes.

In the example of FIG. 3, the hierarchy of map nodes includes building B node 316 and building C node 318. In one example, building B node 316 and building C node 318 are organizational nodes that represent buildings B and C in which floors are located for which RF floor plans are created. In another example, building B node 316 and building node C 318 are map nodes that represent a map image of building B and C in which floors are located for which RF floor plans are created. In the example, building B and building C are located in city B, and therefore the building B node 316 and the building C node 318 are organized beneath the city B node 308. Further in the example of FIG. 3, the hierarchy of map nodes includes floor 1 node 320, floor 1 node 322, and floor 2 node 324. In one example, floor 1 node 320, floor 2 node 322, and floor 2 node 324 are map nodes that represent one or a plurality of map images of floor 1 in building B and floors 1 and 2 in building C. As a result, floor 1 node 320 is organized beneath building B node 316 and floor 1 node 322 and floor 2 node 324 are organized beneath the buildings C node 3318 in the hierarchy of map nodes.

In a specific implementation, the hierarchy of map nodes is presented to a user of a client device when the user is creating floor dimensions, a floor plan, and/or a RF floor plan. In one example, the hierarchy of map nodes is presented in a drop down fashion to the user. Further in the one example, the hierarchy of map nodes is be presented such that when a user selects an organizational node, the nodes in a next level in the hierarchy are presented to the user. For example, in the example hierarchy of map nodes shown in FIG. 3, if a user selected building node A 310, then floor 1 node 312 and floor 2 node 314 are presented to the user in a dropdown list, through which the user can select floor 1 node 312 and floor 2 node 314. Still further in the one example, the hierarchy of map nodes is presented such that when a user selects a map node, the map image that corresponds to the map node is rendered on the graphical user interface of the client device used by the user. For example, if the user selects floor 1 node 312, then the map image that corresponds to floor 1 node 312 is rendered on the user device. Further in the example, the user can use the trace function provided by the RF planning servers described in this paper to create RF floor dimensions using the rendered map image corresponding to floor 1 node 312.

Figure 4:
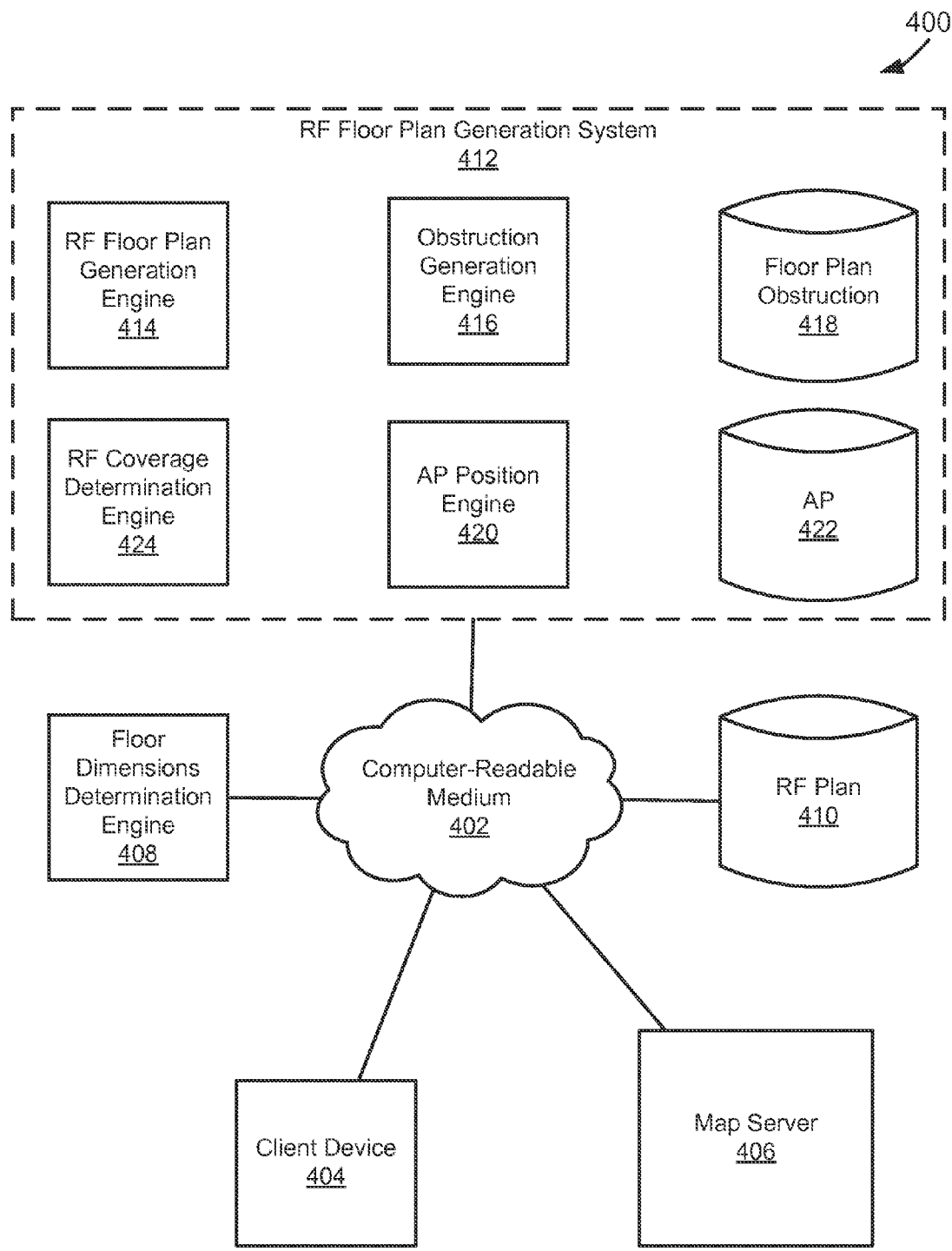
FIG. 4 depicts a diagram of an example of a system for a RF floor plan.

FIG. 4 depicts a diagram 400 of an example of a system for a RF floor plan. The system shown in FIG. 4 includes a computer readable medium 402, a client device 404, a map server 406, a floor dimensions determination engine 408, a RF floor plan generation system 412, and a RF plan datastore 410. The client device 404, the map server 406, the floor dimensions determination engine 408, the RF plan datastore 410, and the RF floor plan generation system 412 are coupled to each other through the computer-readable medium 402.

In a specific implementation, the client device 404 functions according to an applicable device that is capable of receiving and/or generating data, such as the client devices described in this paper. In another specific implementation, the map server 406 functions according to an applicable map image provider, such as the map servers described in this paper. In yet another specific implementation, the floor dimensions determination engine 408 functions according to an applicable floor dimensions calculation system, such as the floor dimensions determination systems described in this paper. In still another specific implementation, the RF floor plan generation system 412 functions according to an applicable RF floor plan generation system, such as the RF floor plan generation systems described in this paper. In a further specific implementation, the RF plan datastore 410 functions according to an applicable RF plan datastore in storing RF plan data, such as the RF plan datastores described in this paper.

The floor plan generation system 412 includes a RF floor plan generation engine 414, an obstruction generation engine 416, a floor plan obstruction datastore 418, an AP position engine 420, an AP datastore 422, and a RF coverage determination engine 424.

In a specific implementation, the RF floor plan generation engine 414 functions to generate a blank floor plan from floor dimensions. In one example, the RF floor plan generation engine 414 generates a blank floor plan from floor dimensions that are included as part of RF plan data stored in the RF plan datastore 410. In another example, the floor dimensions are generated by the floor dimensions determination engine 408. In yet another example, the blank floor plan includes the floor plan of the floor, for which the RF floor plan is being created, with exterior obstructions and without any interior obstructions. Interior obstructions include obstructions located on a floor within the space created by the walls of the building that define the floor dimensions of the floor. For example, the interior obstructions can include the walls that are used to make up cubicles on a floor of an office building. Exterior obstructions include the exterior walls of the building that define the floor dimensions of the floor. In still another example, the RF floor pan generation engine 414 sends the blank floor plan to the client device 404 where it can be displayed to a user through a graphical user interface of the client device 404. Further, in the still another example, in displaying the blank floor plan to the user of the client device 404, the user of the client device can add obstructions and place APs in the blank floor plan, as will be discussed in greater detail later, to create an RF floor plan.

In a specific implementation, the obstruction generation engine 416 provides functionalities to a user of the client device 404 in adding obstructions in creating a floor plan as part of a RF floor plan. In one example, the obstruction generation engine 416 provides functionalities that allow a user to add obstructions to a blank floor plan stored in the RF plan datastore 410.

In a specific implementation, the obstruction generation engine 416 provides an obstruction cursor tool to a user of the client device 404 that allows the user to add interior obstructions, signified by obstruction position data, in creating a floor plan. In one example, the obstruction cursor tool allows a user to draw lines in a floor plan to trace the interior obstructions. For example, the user can trace the interior walls within a floor using the obstruction cursor tool. In another example, the obstruction cursor tool allows a user to draw shapes that represent interior obstructions within the floor plan. In another example, the shape is a polygon. In another example, the user can nest shapes within a shape to create the interior obstructions. In yet another example, the obstruction cursor tool allows a user to move already created interior obstructions in the floor plan. For example, if an interior wall is changed to a different position or was placed incorrectly in a floor plan, the user can select the wall, using the obstruction cursor tool, and move it to the correct position or correct placement within the floor plan.

In a specific implementation, the obstruction generation engine 416 provides a user of the client device 404 with an obstruction characteristics tool that allows the user to specify the characteristics of obstructions, signified by obstruction characteristics data, within a floor plan. In one example, the obstruction characteristics include the thickness and/or the height of obstructions, including the exterior walls and/or windows of the building. In another example, the obstruction characteristics include the material and/or materials used in creating the obstructions. For example, the obstruction characteristics for exterior walls of the building can specify that the walls are comprised of concrete and are four feet thick. In another the example, the obstruction characteristics for cubicles can include the materials that the cubicles are constructed from and the thickness and height of the walls that form the cubicles. In yet another example, the characteristics for an interior wall can specify that the wall is made of drywall and is one foot thick.

In a specific implementation, the RF floor plan generation engine 414 functions to generate a floor plan according to input received from the user of the client device 404 in using the functionalities provided by the obstruction generation engine 416. In one example, the input includes either or both, obstruction position data and obstructions characteristics data. For example, if a user adds an obstruction, moves an obstruction, or changes the characteristics of an obstruction, then the RF floor plan generation engine 414 can update the floor plan to reflect the changes to the floor plan, according to the input received from the user. In another example, the RF floor plan generation engine 414 stores the updated floor plan in the RF plan datastore 410. In yet another example, the RF floor plan generation engine 414 sends the updated floor plan to the client device 404, where it can be displayed to the user through a graphical user interface of the client device 404 in real-time as the user makes changes to the floor plan.

In a specific implementation, the floor plan obstruction datastore 418 functions to store obstruction data. In an example, the obstruction data includes the RF signal propagation characteristics of various materials at varying thicknesses. In one example, the RF signal propagation characteristics include the amount of attenuation of a RF signal that passes through an obstruction comprised of a specific type of material of a specific thickness. For example, the RF signal propagation characteristics can specify that an RF signal loses 8 dB after passing through drywall that is one foot thick. In another example, the RF signal propagation characteristics include how much RF signal attenuation occurs as a result of absorption of the RF signal by an obstruction comprised of a specific material at a specific thickness. In yet another example, the RF signal propagation characteristics include how much RF signal attenuation occurs as a result of absorption of the RF signal by a specific material of a specific thickness upon the RF signal first impinging a surface of an obstruction comprised of the specific material of the specific thickness. In still another example, the RF signal propagation characteristics include how much RF signal attenuation occurs as a result of scattering of the RF signal upon first impinging a surface of an obstruction comprised of a specific type of material of a specific thickness.

In a specific implementation, the AP position engine 420 provides a user of the client device 404 with functionalities for positioning and placing APs, signified by AP position data, in a floor plan to create an RF floor plan. In one example, the AP position engine 420 includes an AP position cursor tool that allows a user of the client device to place an AP in a floor plan. In one example, the floor plan is a floor plan that a user has created by generating floor dimensions according to the methods and techniques described in this paper. In another example, the floor plan is a floor plan that a user has created by adding interior obstructions to a blank floor plan. In still another example, the AP position cursor tool allows a user to place a new AP at a position in the floor plan. In yet another example, the AP position cursor tool allows a user to select an already placed AP and move it to a new position in the floor plan.

In a specific implementation, the AP position engine 420 provides a user of the client device 404 with an AP type selection tool. In one example the AP type selection tool allows the user to select the type of AP, signified by AP type data, which is positioned or placed in a floor plan in creating a RF floor plan. In another example, the AP type selection tool allows the user to select an AP provided by a specific manufacturer. In yet another example, the AP type selection tool allows the user to select a specific AP based on the operational parameters of the AP. In another example, the operational parameters of the AP can include the type of devices that will connect to the AP and/or the average number of devices that will connect to the AP at a given time. In still another example, the AP type selection tool can be a drop down list that allows a user to select a specific AP or a specific manufacturer of APs.

In a specific implementation, the AP datastore 422, includes AP data. In one example, the AP data includes the operational parameters of various types of APs. Further in the one example, the various types of APs include the APs that were place in the floor plan to create the RF floor plan through the AP position engine 420. In another example, the operational parameters of various types of APs include the frequency ranges of RF signals generated and received by an AP. In yet another example, the operational parameters of various types of APs include the average signal strength of RF signals generated by an AP. In still another example, the operational parameters of various types of APs include the received signal strength indication (hereinafter referred to as "RSSI") of an AP. Further in the still another example, the operational parameters can include the RSSI scale and the RSSI for a specific distance away from APs. In yet another example, the operational parameters of various types of APs includes the round-trip time (hereinafter referred to as "RTT") for signals generated by an AP. In a further example, the operational parameters include variances in the previously described examples of operational parameters based on the number of devices that are connected to an AP at a given time.

In a specific implementation, the RF floor plan generation engine 414 functions to generate a RF floor plan according to input received from the user of the client device 404 in using the functionalities provided by the AP position engine 420. In one example, the input includes either or both AP position data and AP type data. For example, if a user adds an AP, moves an AP or changes the type of AP, then the RF floor plan generation engine 414 can update the RF floor plan to reflect the changes to the RF floor plan, according to the input received from the user. In another example, the RF floor plan generation engine 414 stores the updated RF floor plan in the RF plan datastore 410. In yet another example, the RF floor plan generation engine 414 sends the updated RF floor plan to the client device 404, where it can be displayed to the user through a graphical user interface of the client device 404 in real-time as the user makes changes to the RF floor plan.

In a specific implementation, the RF coverage determination engine 424, functions to simulate RF coverage of APs in a specific RF floor plan. In an example, the RF coverage determination engine 424 simulates RF coverage based, at least in part, on obstruction data contained in the floor plan obstruction datastore 418 and AP data contained in the AP datastore 422. In another example, the RF coverage determination engine 424 simulates RF coverage based, at least in part, on the specific RF floor plan generated by the RF floor plan generation engine 414 and stored in the RF plan datastore 410.

In a specific implementation, the RF coverage determination engine 424 the RF coverage determination engine 424 simulates RF coverage for a specific AP by simulating RF coverage for the AP based on the operational parameters of the specific AP and the signal propagation characteristics of the materials and the thickness of the materials that form the obstructions in the vicinity of the specific AP. For example, if an AP is contained within a room in the floor that is formed by one foot thick drywall, then the RF coverage determination engine 424 can determine the RF coverage provided for by the AP by simulating the coverage of the AP based on the operational parameters of the AP and the signal propagation characteristics of one foot thick drywall. In still another example, the RF coverage determination engine 214 can determine RF coverage by simulating RF coverage for an AP based, at least in part, on input regarding the operational parameters for the AP received from a user of the client device 404.

In a specific implementation, the RF floor plan generation engine 414 functions to update a RF floor plan to include a representation of the simulated RF coverage for one or a plurality of APs within the RF floor plan, as is determined by the RF coverage determination engine 424. In one example, the RF floor plan generation engine 414 can modify the RF floor plan to represent the simulated RF coverage through a heat map around the AP for which the RF coverage was simulated. Further in the one example, the heat map changes in color as the simulated RF coverage changes at positions further or closer to the AP. In another example, the RF floor plan generation engine 414 stores the updated RF floor plan that includes a representation of the simulated RF coverage in the RF plan datastore 410. In yet another example, the RF floor plan generation engine 414 sends the updated RF floor plan including the simulated RF coverage to the client device 404 for display to a user through a graphical user interface of the client device 404. Further in the yet another example, the user of the client device 404 can modify the placement of specific APs or the type of specific APs in the RF floor plan based on the simulated RF coverage.

In an example of operation of the system shown in FIG. 4, the floor dimension determination engine 408 determines floor dimensions based on map data retrieved from the map server 406, and input received by a user of the client device 404. Further in the example of operation, RF floor plan generation engine 414 generates a blank floor plan based on the floor dimensions determined by the floor dimension determination engine 408. Also further in the example of operation, the obstruction generation engine 416 provides functionalities to a user in placing, positioning and defining obstruction characteristics in the blank floor plan. In the example of operation, the floor plan generation engine 414 generates a floor plan from the blank floor plan based on the input received by the user in interacting with the functionalities provided for by the obstruction generation engine 416.

In the example of operation of the system shown in FIG. 4, the AP position engine 420 provides functionalities to a user in placing, positioning an AP and specifying the type of AP that a placed AP is. Further in the example of operation, the RF floor plan generation engine 414 generates a RF floor plan based on the input received from the user in interacting with the functionalities provided for by the AP position engine 420. Still further in the example of operation, the RF coverage determination engine 424 determines RF coverage for at least one AP in a RF floor plan by simulating RF coverage for the AP. In the example of operation, the RF coverage determination engine 424 simulates coverage based on the RF floor plan, obstruction data stored in the floor plan obstruction datastore 418, and AP data stored in the AP datastore 422. Still further in the example of operation, the RF floor plan generation engine 414 updates the RF floor plan to include a representation of the simulated RF coverage.

Figure 5:
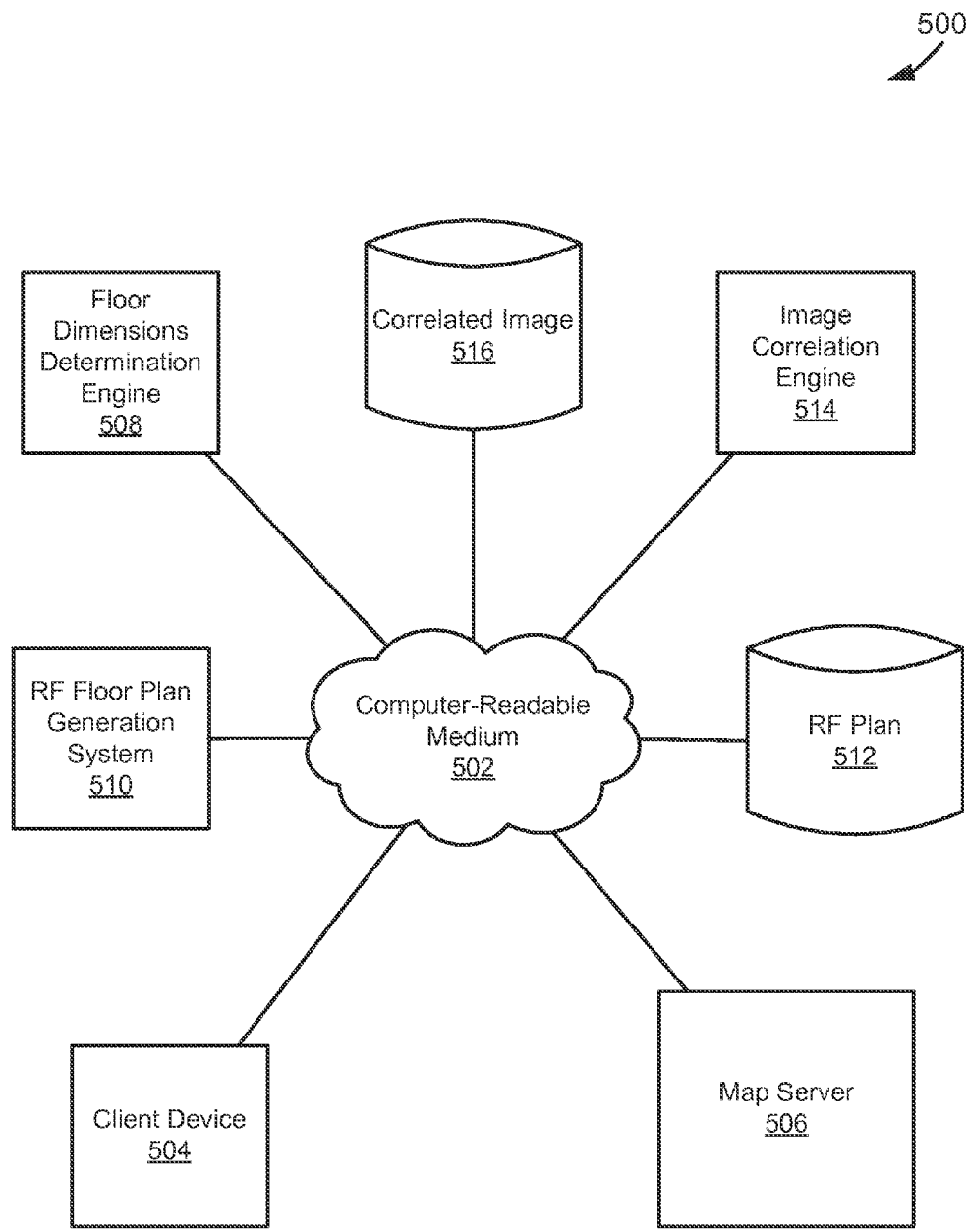
FIG. 5 depicts a diagram of another example of a system for generating floor dimensions.

FIG. 5 depicts a diagram 500 of another example of a system for generating floor dimensions. The system shown in FIG. 5 includes a computer-readable medium 502, a client device 504, a map sever 506, a floor dimension determination engine 508, a RF floor plan generation system 510, a RF plan datastore 512, an image correlation engine 514, and a correlated image datastore 516. The client device 504, the map server 506, the floor dimension determination engine 508, the RF floor plan generation system 510, the RF plan datastore 512, the image correlation engine 514, and the correlated image datastore 516 are coupled to each other through the computer-readable medium 502.

In a specific implementation, the client device 504 functions according to an applicable device that is capable of receiving and/or generating data, such as the client devices described in this paper. In another specific implementation, the map server 506 functions according to an applicable map image provider, such as the map servers described in this paper. In yet another specific implementation, the floor dimensions determination engine 508 functions according to an applicable floor dimensions calculation system, such as the floor dimensions determination systems described in this paper. In still another specific implementation, the RF floor plan generation system 510 functions according to an applicable RF floor plan generation system, such as the RF floor plan generation systems described in this paper. In a further specific implementation, the RF plan datastore 512 functions according to an applicable RF plan datastore in storing RF plan data, such as the RF plan datastores described in this paper.

In a specific implementation, the image correlation engine 514 receives map data that is sent from the client device 504. Further in the specific implementation, the image correlation engine 514 can be implemented as part of an RF planning server, such as the RF planning servers described in this paper. In one example, the image correlation engine 514 receives the map data from an applicable system or engine, such as the system or engines described in this paper after the applicable systems or engines receive the map data from the client device 504. In another example, the client device 504 receives the map data from the map server 506. In another example, the map data includes map data for an image that is a satellite or aerial view of a building and a map image of a street level view of the building. In still another example, the image correlation engine 514 receives a map image of a street level view of a building that is not received from the map server 506. For example, the image correlation engine 514 can receive map data, including a map image of a street level view of a building, which is taken by a user of the client device 504 using the client device 504. Further in another example, the user can take a photo that is a map image using a smart phone, the map image being a street level view of a building.

In a specific implementation, the image correlation engine 514 provides functionalities to a user of the client device 504 in correlating images. In one example, the functionalities provided for by the image correlation engine 514 allow the user to generate input used to correlate a map image of an aerial or satellite view of a building with a map image of a street level view of a building. In another example, the image correlation engine 514 provides an image correlation cursor tool to a user of the client device 504 to generate input.

In a specific implementation, an image correlation cursor tool, provided for by the image correlation engine 514, allows a user to create a reference, signified by reference data, in a map image of an aerial or satellite view and a scale in a map image of a street level view that are used to correlate the map image of a street level view with the map image of an aerial or satellite view. In one example, a user of the client device 504 uses the image correlation cursor tool to draw a reference line in the map image of an aerial or satellite view that servers as the reference in the map image of an aerial or satellite view. In another example, a user of the client device 504 uses the image correlation cursor tool to highlight or signify an object in the map image of an aerial or satellite view as a reference in the image. In still another example, a user of the client device 504 uses the image correlation cursor tool to draw a scale line, signified by scale data, in a map image of a street level view that serves as the scale in the map image of a street level view. In yet another example, a user of the client device 504 uses the image correlation cursor tool to highlight or signify a scale object, signified by scale data, in the map image of a street level view that serves as the scale in the map image of a street level view. Further in another example, the scale line or scale object in the map image of a street level view has the same length or dimensions in the physical space as the reference line or reference object in the map image of an aerial or satellite view. For example, a user can create a reference that is a line and a scale that is a line along the same edge of a building in both the map image of an aerial or satellite view and the map image of a street level view. In an additional example, a user creates a reference that is an object and a scale that is an object using the same object in both the map image of an aerial or satellite view and the map image of a street level view. For example, a user can create a reference from a specific window in the map image of an aerial or satellite view and a scale from the same specific window in the map image of a street level view.

In a specific implementation, the image correlation engine 514 functions to correlate a map image of an aerial or satellite view with a map image of a street level view using a user selected reference in the map image of an aerial or satellite view and the user selected scale in the map image of a street level view. In an example, the user selected scale and the user selected reference are signified by scale data and reference data received by the image correlation engine 514 from the user. In one example, the image correlation engine 514 correlates based on reference data and scale data received from the client device 504. In an additional example, the image correlation engine 514 determines the length or the dimensions of a reference line or a reference object in the map image of an aerial or satellite view. In a specific example of the one example, the image correlation engine 514 determines the length or dimensions in the physical space of a reference line or a reference object in the map image of an aerial or satellite view from map data associated with the map image. For example, the image correlation engine 514 can determine the length in the physical space of a reference line in the map image of an aerial or satellite view from latitude and longitudinal coordinates included as part of the map data for the map image of an aerial or satellite view. In another example, the image correlation engine 514 determines the length or dimensions in the physical space of the scale in the map image of a street level view using the determined length or dimensions in the physical space of the reference in the map image of an aerial or satellite view, thereby correlating the map image of a street level view with the map image of an aerial or satellite view. For example, the image correlation engine 514 can determine that the length or the dimensions in the physical space of the scale in the map image of a street level view are the same as the length or the dimensions in the physical space of the reference in the map image of an aerial or satellite view, thereby correlating the map image of a street level view with the map image of an aerial or satellite view. In a further example, the image correlation engine determines a dimension or length in the physical space of a scale represented by pixels, included as part of map data, in the map image of a street level view is the same as the dimensions or length in the physical space of a reference represented by pixels, included as part of map data, in the map image of an aerial or satellite view.

In a specific implementation, the correlated image datastore 516 stores correlated image data. Further in the specific implementation, the correlated image datastore 516 is implemented as part of an RF planning server, such as the RF planning servers described in this paper. In one example, the correlated image data includes the map data of a correlated map image of an aerial or satellite view and a map image of a street level view. In another example, the correlated image data includes the determined length or the dimensions of a reference in a map image of an aerial or satellite view of the correlated images. In still another example, the correlated image data includes the determined length or dimensions of a scale in a street level view image of the correlated images. Further in the still another example, the correlated image data includes the dimensions or length in the physical space of either or both a scale represented by pixels in the map image of a street level view and a reference represented by pixels in the map image of an aerial or satellite view.

In a specific implementation, a floor cursor tool, provided for by the floor dimension determination engine 508, allows a user to create a trace outline of floor dimensions in a map image of a street level view. In another example, the floor cursor tool includes a line drawing tool that allows a user to create trace lines that form a side view trace outline of the floor. In yet another example, the floor cursor tool includes a shape tool that allows a user to create shapes, of which the sides form, at least in part, the trace lines that form, at least in part, the trace outline of the floor. Further in the yet another example, the shape tool allows a user to create shapes of varying sizes and type in forming, at least in part, the trace outline of the floor.

In a specific implementation, the floor dimension determination engine 508 functions to generate floor dimensions of a floor based on a trace outline of a side view of a floor generated by a floor cursor tool provided for by the floor dimension determination engine 508. In one example of the specific implementation, the floor dimensions determined by the floor dimension determination engine 508 include the height of the ceilings of a floor for which the floor dimensions are created. In another example, the floor dimension determination engine 508 uses the dimensions or length in the physical space to determine the length or dimensions of the floor in the physical space. For example, the floor dimension determination engine 508 can use a determined length or dimensions of the scale, includes as part of the correlated image data, in the physical space represented between pixels in a map image of a street level view to determine the floor dimensions in the physical space of a floor based on a trace outline of a side view of the floor created in the map image of the street level view. In still another example, the determined length or dimensions in the physical space represent a height of the floor.

In a specific implementation, the floor plan generation system 510 generates a RF floor plan and provides a user of the client device 504 with functionalities for generating a floor plan based on floor dimensions. In an example the floor plan generation system 510 functions according to an applicable floor plan generation system, such as the floor plan generation systems described in this paper. In yet another example, the floor plan generation system 510 provides functionalities for generating an RF floor plan or generates an RF floor plan based on floor dimensions, including a height of a floor, determined by the by the floor dimension determination engine 508. In still another example, the RF floor plan generated by the RF floor plan generation system 510, is stored in the RF plan datastore 512.

In an example of operation of the system shown in FIG. 5, the image correlation engine 514 provides an image correlation cursor tool that allows a user of the client device 504 to draw or designate a reference in a map image of an aerial or satellite view received from the map server 506. Further in the example of operation, the image correlation engine 514 provides an image correlation cursor tool that allows a user of the client device 504 to draw or designate a scale in a map image of a street level view. Still further in the example of operation, the image correlation engine 514 correlates the map image of the street level view and the aerial or map image to create correlated image data that is stored in the correlated image datastore 516. In the example of operation, the floor dimensions determination engine 508 determines floor dimensions, including the height of a floor, based, at least in part, on the correlated image data. Also further in the example of operation, the RF plan generation system 510 either or both provides functionalities to a user of the client device 504 for generating a RF floor plan, based at least in part, on the floor dimensions, including the height of a floor, determined by the floor dimensions determination engine 508. Still further in the example of operation, the RF floor plan, generated by the RF floor plan generation system 510, is stored in the RF plan datastore 512.

Figure 6:
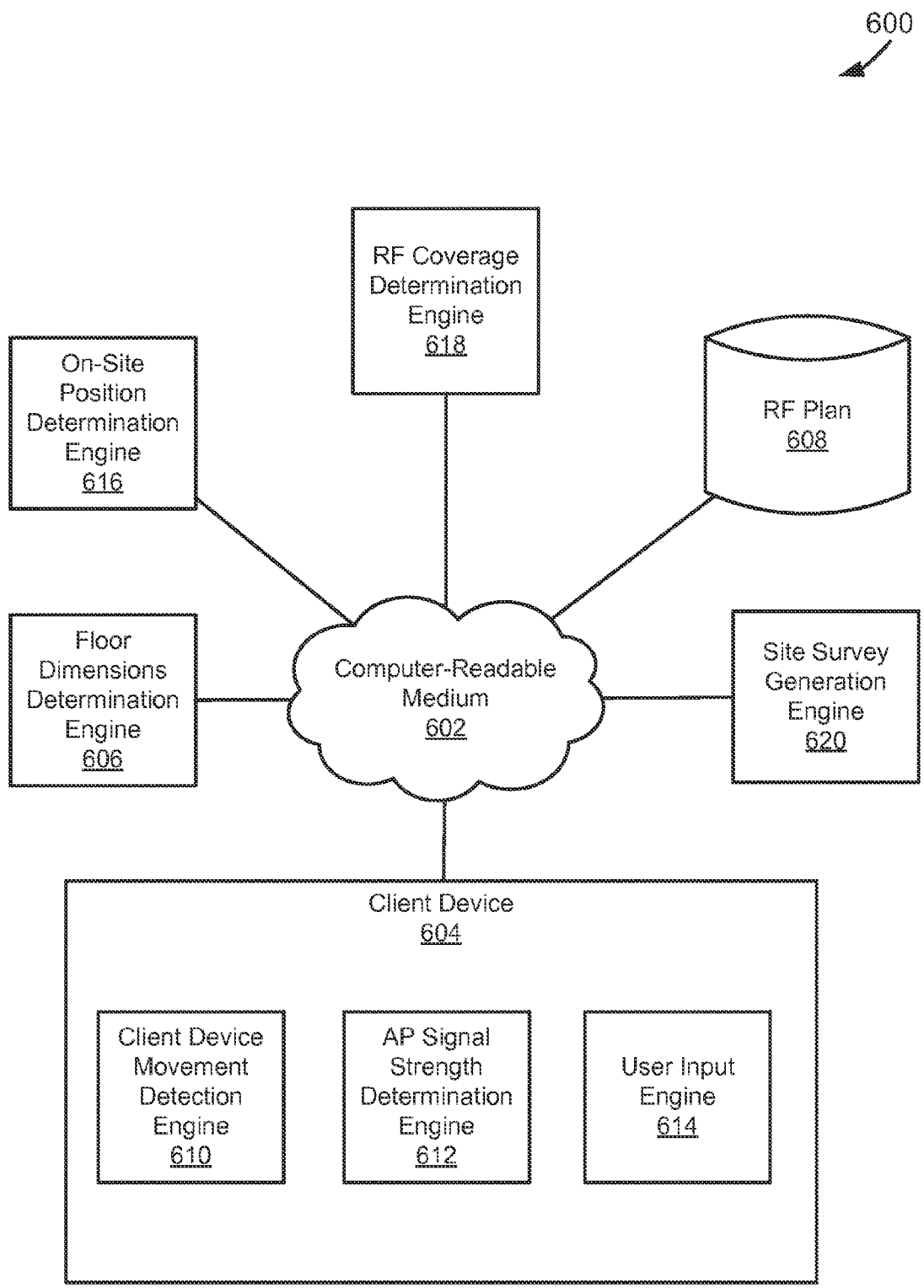
FIG. 6 depicts a diagram of another example of a system for conducting a site survey.

FIG. 6 depicts a diagram 600 of another example of a system for conducting a site survey. The example system shown in FIG. 6 includes a computer-readable medium 602, a client device 604, a map server 606, a floor dimensions determination engine 606, a RF plan datastore 608, a site position determination engine 616, a RF coverage determination engine 618, and a site survey generation engine 620. The client device 604, the map server 606, the floor dimensions determination engine 606, the RF plan datastore 608, the site position determination engine 616, the RF coverage determination engine 618, and the site survey generation engine 620 are coupled to each other through the computer-readable medium 602.

In a specific implementation, the client device 604 functions according to an applicable device that is capable of receiving and/or generating data, such as the client devices described in this paper. In another specific implementation, the floor dimensions determination engine 606 functions according to an applicable floor dimensions calculation system, such as the floor dimensions determination systems described in this paper. In a further specific implementation, the RF plan datastore 608 functions according to an applicable RF plan datastore in storing RF plan data, such as the RF plan datastores described in this paper.

The client device includes 604 a client device movement detection engine 610, an AP signal strength determination engine 612, and a user input engine 614. In a specific implementation, the client device movement determination engine 616 functions to determine movement data representing the movement of a client device 604. In one example, the client device movement detection engine 610 determines the movement of the client device 604 as the client device is displaced within a site while performing a user of the client device 604 performs a site survey of the site. In another example, the client device movement detection engine 610 is a pedometer that is integrated as part of the client device 604. Further in another example, the client device movement detection engine 610, in being implemented as a pedometer, receives input from a user of the client device 604 to determine the average distance that the user of the client device 604 covers while stepping. Still further in the another example, the client device movement detection engine 610 can determine the distance that the client device 604 has been displaced during a specific amount of time using, at least in part, the determined average distance that the user of the client device 604 covers while stepping. Still, in another example, the client device movement detection engine 610 includes an accelerometer that determines the acceleration of the client device 604 as it is moved.

In a specific implementation, the AP signal strength determination engine 612 functions to measure the strength of RF signals at specific points within a site. In an example, the AP signal strength determination engine 612 generates signal strength data that indicates RF signal strength at specific points within a site. In one example, the AP signal strength determination engine 612 measures the strength of an RF signal at a specific point within a site, while a user of the client device 604 performs a site survey of the site. In another example, the AP signal strength determination engine 612 is integrated as part of an electromagnetic field (hereinafter referred to as "EMF") detector that measures EMF strength. For example, the EMF detector can be integrated as a unit that is separate from the client device 604 that couples directly to the client device 604 in determining RF signal strength, such as an AP listening for, e.g., clients in its neighborhood, or can be integrated in a chipset of the client device 604 listening for, e.g., APs in its neighborhood, such as a wifi chipset. In yet another example, the functioning of the AP signal strength determination engine 612 is controlled by a user of the client device 604. For example, the user of the client device 604 can control when to turn the AP signal strength determination engine 612 on to begin measuring the strength of an RF signal. In a further example, the AP signal strength determination engine 612 measures signal strengths for multiple RF signal at a specific point.

In a specific implementation, the user input engine 614 functions to generate and/or receive user input for a user of the client device 604. In one example, the user input indicates the placement of an AP within a site at which a site survey is conducted. For example, the user of the client device 604 can generate user input indicating the placement of an AP by interacting with the client device, e.g. activating a radio button in a graphical user interface, when the client device 604 is located beneath the AP. Further in the one example, the placement of the AP within the site represents that an AP is in the site at the location where the client device is located when the user interacted with the client device to generate user input indicating the placement of the AP. In another example, the user input indicates the location of the client device 606 or a user of the client device 604 in a floor plan or a RF floor plan for a site at which a site survey is conducted. For example, the user input can be created, as a user of the client device 604 views a floor plan, or a RF floor plan on a graphical user interface of the device and interacts with the client device 604 to indicate a location of the client device 604 or the user of the client device 604 in the floor plan or the RF floor plan. For example, a user of the client device 604 can interact with the client device 604 when the user is at the entrance to a site, thereby creating user input indicating the location of the client device 604 or a user of the client device 604 at the entrance to the site. In the another example, the location in the floor plan or the RF floor plan that the user input indicates as the location of the client device 604 can serve as a reference point, as will be discussed in greater detail later, for determining the position of APs within the site and the client device 604 as it is moved within the site.

In a specific implementation, the floor plan or RF floor plan that is displayed on the client device 604 for generating input indicating the position of the client device 604 or a user of the client device 604 in the floor plan or RF floor plan is included as part of RF plan data stored in the RF plan datastore 608. In one example, the RF floor plan or floor plan included as part of the RF plan data is generated from floor dimensions generated by the floor dimensions determination engine 606. In another example, the floor dimensions determination engine 606 determines the floor dimensions based on input received from the user of the client device 604 on-site at the site where the site survey is conducted. Subsequently a floor plan or RF floor plan, can be generated while the user of the client device 604 is on-site at the site where the site survey is conducted.

In a specific implementation, the site position determination engine 616 functions to determine the position of a client device 604 and/or a user of the client device 604 within a site as the client device 604 and/or user of the client device 604 moves within the site. In one example, the site position determine engine 616 functions to determine the position of a client device 604 and/or a user of the client device 604 within a site, at which a site survey is conducted. In yet another example, the site position determination engine 616 functions to determine the position of a client device 604 and/or a user of the client device 604 within a site as a site survey is conducted at the site.

In a specific implementation, the site position determination engine 616 functions to generate location data that indicates the position of a client device 604 and/or user of the client device 604 within a site and a corresponding floor plan and/or RF floor plan based on user input from a user of the client device 604 and movement data generated by the client device movement detection engine 610. In one example, the site position determination engine 616 uses the position within the floor or plan or RF plan at which the user input indicates that the client device 604 is at a specific time as a reference point in determining the location of the client device 604 or a user of the client device 604 within a site and corresponding floor plan or RF floor plan. In another example, the site position determination engine 616 uses the position within the floor plan or RF plan, as indicated by the user input received and/or generated through the user input engine 614, and movement data of the client device 604, generated by the client device movement detection engine 610, to determine location data that indicates the position of the client device 604 or a user of the client device 604 within a site and a corresponding floor plan or RF floor plan. In the another example, the site position determination engine 616 determines the position of the client device 604 in the site based on the amount that the client device 604 is displaced from the reference point as is determined from the movement data generated by the client device movement detection engine 610. For example, if the movement data indicates that the client device has been displaced 20 feet north and 20 feet west from the reference point, then the site position determination engine 616 can generate location data that indicates that the client device 604 and/or a user of the client device 604 is at a position that is 20 feet north and 20 feet west of the reference point within the site.

In a specific implementation, the site position determination engine 616 functions to generate location data that indicates the location of an AP within a site and a corresponding floor plan and/or RF floor plan. In one example, the site position determination engine 616 determines the position within a site based on user input from a user of the client device 604 and movement data generated by the client device movement detection engine 610. In an example, the site position determination engine 616 uses the location of the client device 604 within the site, corresponding to a position in the floor plan, at which the user input indicates that the AP is placed in determining the location of the AP within the site. In another example, the site position determination engine 616 uses the position within the floor plan of the client device that serves as a reference point and the placement of the AP, as indicated by the user input received and/or generated through the user input engine 614, and movement data of the client device 604, generated by the client device movement detection engine 610, to determine location data that indicates the location of an AP within a site, and a corresponding floor plan of the site. In the another example, the site position determination engine 616 determines the position of an AP in the site based on the amount that the client device 604 is displaced from the reference point, as is determined from the movement data generated by the client device movement detection engine 610, to the position of the client device where user input was created indicating the placement of the AP within the site. For example, if the user input indicates that an AP is placed at point A and movement data indicates that the client device has been displaced 20 feet north and 20 feet west from the reference point to become located at point A, then the site position determination engine 616 can generate location data that indicates that the AP is positioned 20 feet north and 20 feet west of the reference point within the site.

In a specific implementation, the RF coverage determination engine 618 functions according to an applicable system for determining RF coverage of an AP, such as the RF coverage determination engines described in this paper. In an example, the RF coverage determination engine 618 determines RF coverage at specific points within a site and a corresponding floor plan and/or RF floor plan for which a site survey is conducted. In one example, the RF coverage determination engine 618 determines RF coverage based on signal strength data generate by the AP signal strength determination engine 612. In another example, the RF coverage determination engine 618 determines RF coverage based on both signal strength data and location data indicating the position of the client device. For example, if the position data indicates that the client device is at location A within the site, when signal strength A data was determined, then the RF coverage determination engine 618 can determine a signal strength, indicated by signal strength A data, exists at location A. Further in the example, the RF coverage determination engine 618 can use the determined signal strength, indicated by signal strength A data to determine the RF coverage.

In a specific implementation, the site survey generation engine 620 functions to generate a site survey based on location data generated by the site position determination engine 616 and a floor plan of the site. In an example, the floor plan of the site is stored in the RF plan datastore 608. In one example of the example, the floor plan of the site can only include the exterior obstructions of the site, created by using the floor dimensions of the site determined by the floor dimensions determination engine 606. In another example, the site survey generation engine 620 places APs within a floor plan to generate a RF floor plan of the site, included as part of a site survey, based on the location data generated by the site position determination engine 616 and indicating the location of an AP within the site. For example, if the location data indicates that an AP is located 20 feet north and 20 feet west from an entrance door to a site, then the site survey generation engine 620 can place an AP at a location 20 feet north and 20 feet west from the entrance door in a floor plan of the site to generate a RF floor plan of the site that is included as part of a site survey.

In a specific implementation, the site survey generation engine 620 functions to generate a site survey based on location data generated by the site position determination engine 616, RF coverage data determined by the RF coverage determination engine 618 and a floor plan and/or a RF floor plan of the site. In an example, the floor plan and/or the RF floor plan of the site are stored in the RF plan datastore 608. In one example of the example, the floor plan and/or the RF floor plan of the site can include exterior obstructions of the site, created by using the floor dimensions of the site determined by the floor dimensions determination engine 606, and not interior obstructions of the site. In another example, the site survey generation engine 620 adds RF coverage levels to the floor plan and/or the RF floor plan of the site based on the RF coverage determined by the RF coverage determination engine 618 and the location of the client device within the site, and the corresponding floor plan or RF floor plan at which the RF coverage is determined. In still another example, the site survey generation engine 620 adds RF coverage levels at specific points within the floor plan and/or the RF floor plan of the site. In a further example, the RF coverage levels at specific points within the floor plan and/or the RF floor plan are represented as a heat map within the floor plan and/or the RF floor plan. In still another example, the site survey generation engine 620 stores the floor plan and/or RF floor plan with the RF coverage levels at specific points, in the RF plan datastore 608. In still a further example, the floor plan and/or the RF floor plan with RF coverage levels at specific points, forms part of a site survey for the site.

In an example of operation of the system shown in FIG. 6, the client device 604 functions to generate and or receive data. Further in the example of operation, the floor dimensions determination engine 606 functions to generate floor dimensions for a floor at a site at which a site survey is being conducted. The floor plans are stored in the RF plan datastore 608. Still in an example of operation, the client device movement detection engine 610 functions to determine movement data indicating the movement of the client device 604 within a site as a site survey is conducted. Further in the example of operation, the AP signal strength determination engine functions to determine RF signal strength at various points within the site as the site survey is conducted. Still further in the example of operation, the user input engine 614 functions to allow a user to generate user input regarding the location of APs within the site and the client device 604 within a floor plan.

In an example of operation, the site position determination engine 616 determine the location of a client device within a site and a corresponding floor plan and/or a RF floor plan based on user input and movement data generated by the client device movement detection engine 610. Further in the example of operation, the site position determination engine 616 determines the location of an AP within a site and a corresponding floor plan and/or a RF floor plan based on user input and movement data generated by the client device movement detection engine 610. In the example of operation, the RF coverage determination engine 618 functions to determine RF coverage at specific points within the site. Still further in the example of operation, the site survey generation engine 620 functions to generate a site survey that includes RF coverage levels at various points within a RF floor plan, based on the data generated and or determined by the site position determination engine 616 and the RF coverage determination engine 618.

Figure 7:
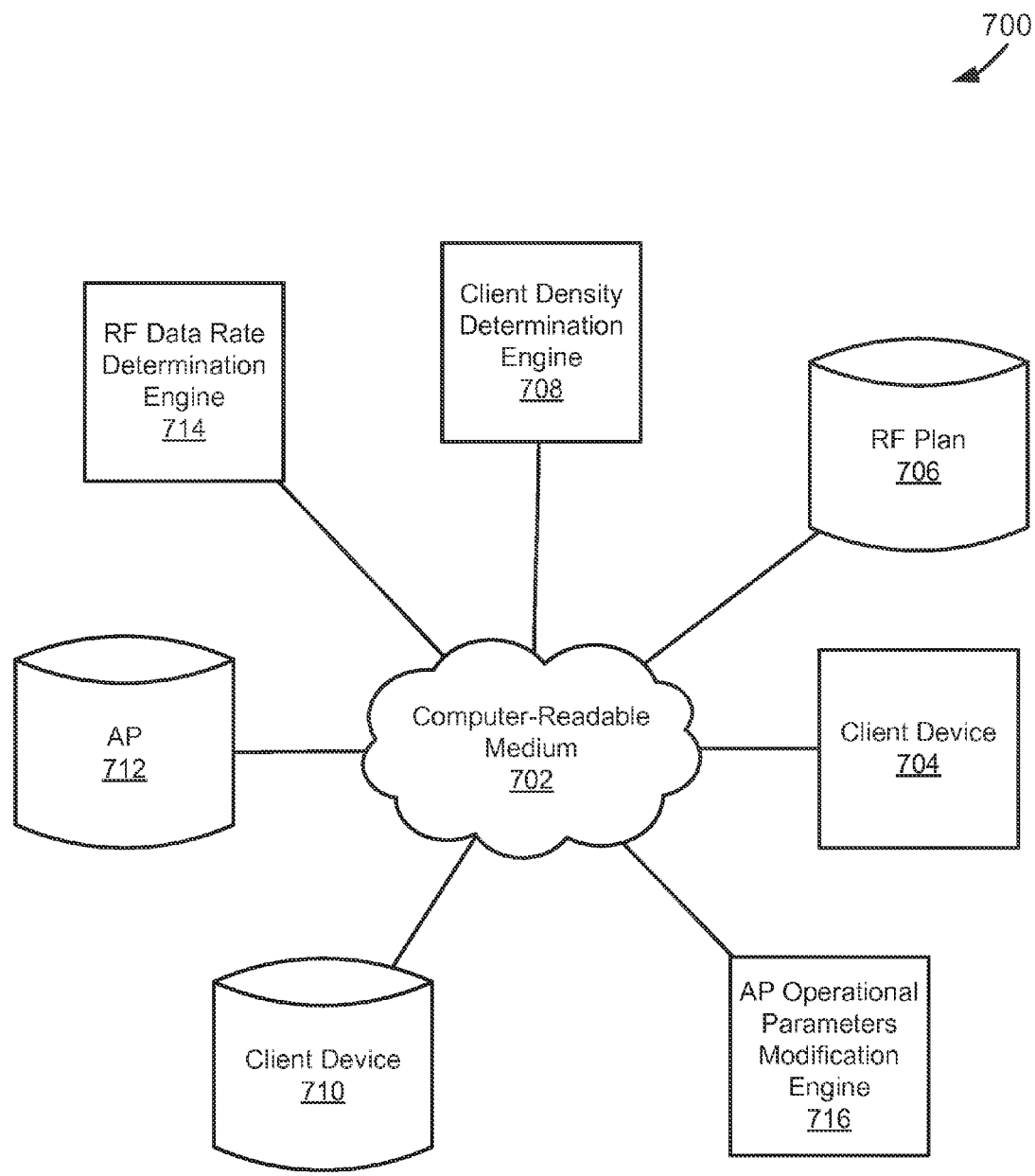
FIG. 7 depicts a diagram of an example of a system for determining RF data rates of APs and ideal operational parameters from the determined RF data rates.

FIG. 7 depicts a diagram 700 of an example of a system for determining RF data rates of APs and ideal operational parameters from the determined RF data rates. In one implementation, the example system shown in FIG. 7, can be integrated with the various other example systems in the FIGS. of this paper in determining RF data rates for APs and ideal operational parameters for APs. The example system shown in FIG. 7 includes a computer-readable medium 702, a client device 704, a RF plan datastore 706, a client density determination engine 708, a client device datastore 710, an AP datastore 712, a RF data rate determination engine 714, and an AP operational parameters modification engine 716. The client device 704, the RF plan datastore 706, the client density determination engine 708, the client device datastore 710, the AP datastore 712, the RF data coverage determination engine 714, and the AP operational parameters modification engine 716 are coupled to each other through the computer-readable medium 702.

In a specific implementation, the client device 704 functions according to an applicable device that is capable of receiving and/or generating data, such as the client devices described in this paper. In one example, the client device functions to generate user input of a user using the client device 704. In a specific implementation, the RF plan datastore 706 functions to store data according to an applicable RF plan datastore, such as the RF plan datastores described in this paper.

In a specific implementation, the client density determination engine 708 functions to determine client density data that indicates the number of clients that are connected to a specific AP at a given time. In one example, the client density determination engine 708 determines client density data by averaging the number of client devices that are connect to an AP over a period of time. In another example, the client density determination engine 708 determines client density data based on user input from the client device 704. For example, a user of the client device 704 can input that ten people are usually connected to a specific AP. In still another example, the specific AP which the client density data is generated for is represented in a RF floor plan stored in the RF plan datastore 706.

In a specific implementation, the client device datastore 710 functions to store client device data. In one example, the client device data includes the operational parameters of various types of client device. In another example, the client device data includes an average of the amount of wireless bandwidth a client device of a specific type uses. In still another example, the client device data includes the type of client device, e.g. a smart phone, a laptop, or a tablet.

In a specific implementation, the AP datastore 712 functions according to an applicable datastore in storing AP data, such as the AP datastores described in this paper. In one example, the AP data includes the operational parameters of various types of APs. In an example, the operational parameters of various types of APs include the previously described operational parameters of an AP. In another example, the operational parameters include the maximum power that an AP can broadcast over a channel.

In a specific implementation, the RF data rate determination engine 714 functions to determine a data rate for an AP. In one example, the AP is represented in a RF floor plan stored in the RF plan datastore 706. In another example, the RF data rate determination engine 714 determines the data rate for an AP based on client density data determined by the client density determination engine 708, client device data store in the client device datastore 710, and AP data stored in the AP datastore 712.

In a specific implementation, the RF data rate determination engine 714 functions to calculate an average data rate for an AP based on client density data and client device data stored in the client device datastore 710. For example, if the client density data indicates that ten client devices are connected to an AP at a time, then the RF data rate determination engine 714 can calculate the average data rate for the AP. Further in the example, the RF data rate determination engine 714 can calculate the average data rate for the AP by determining the data bandwidth for each of the 10 client devices from the client data stored in the client device datastore 710 and summing the data bandwidth for each of the 10 client devices to determine the average data rate for the AP.

In a specific implementation, the AP operational parameters modification engine 716 functions to determined ideal operational parameters based on an average data rate for an AP determined by the RF data rate determination engine 714. In an example, the AP operational parameters modification engine 716 determines ideal operational parameters based on an average data rate for a specific AP and AP data for the specific AP stored in the AP datastore 712. In one example, the AP operational parameters modification engine 716 determines ideal operational parameters that include the minimum amount of transmit power that the AP needs to operate at in order to satisfy the determined average data rate. In still another example, the operational parameters modification determines ideal operational parameters that vary based on the number of client devices that are connected to a specific AP. Further, in another example, in a specific AP operating at ideal operational parameters, the amount of interference with other APs surrounding the specific AP is decreased. In still another example, the AP operational parameters modification engine 716 stores the determined ideal operational parameters as part of RF plan data in the RF plan datastore 706. As a result, a user or supervisor can configure the APs at a site to operate according to the determined ideal operational parameters.

In an example of operation of the system shown in FIG. 7, the client device 704 functions to generate and receive data. Further in the example of operation, the RF plan datastore 706 functions to store RF plan data. In the example of operation, the client density determination engine 708 determines client density data for a specific AP. Still in the example of operation, the client device datastore 710 functions to store client device data, including the operational parameters of various types of client devices. In the example of operation, the AP datastore 712, stored AP data for various types of APs. Further in the example of operation, the RF data rate determination engine 714 determines an average data rate for a specific AP using the client density data determined by the client density determination engine 708, and client device data stored in the client device datastore 710. Still in the example of operation, the AP operational parameters modification engine 716 determines ideal operational parameters for a specific AP based on the average data rate for the specific AP, determined by the RF data rate determination engine 714, and AP data, including AP operational parameters, stored in the AP datastore 712.

Figure 8:
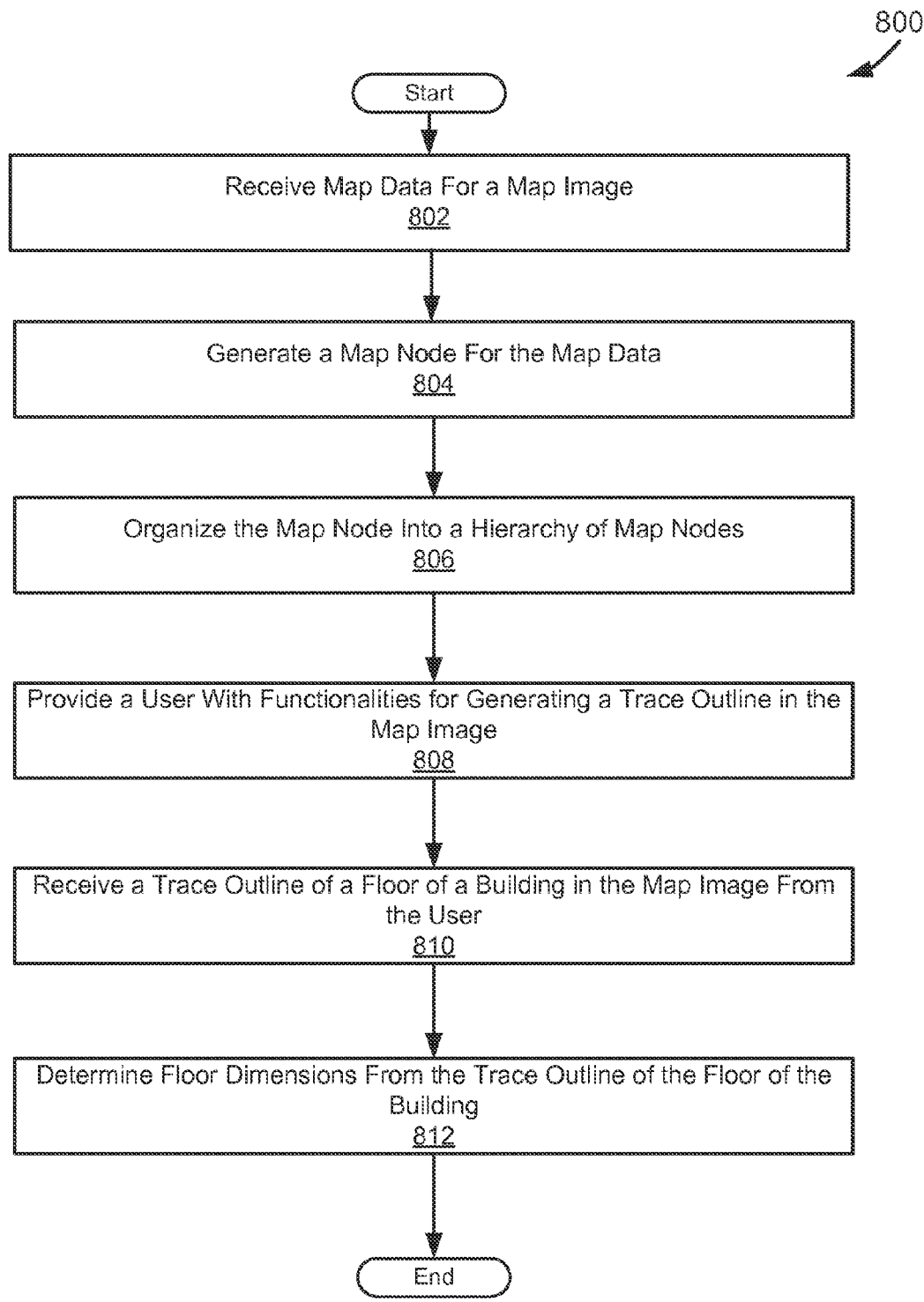
FIG. 8 depicts a diagram of a flowchart of an example of a method for determining floor dimensions from a map image.

FIG. 8 depicts a diagram 800 of a flowchart of an example of a method for determining floor dimensions from a map image. The flowchart begins at module 802 where map data for a map image is received. In one example, the map image is a satellite or an aerial view. In another example, the map image is a street level view. In yet another example, the map data, includes map image data that is used to render the map image of the corresponding map data on a graphical user interface of a client device. In still another example, the map data is received from a map server. In yet a further example, the map data is generated by a user of the client device, such as taking a photo using a smart phone.

The flowchart continues to module 804, where a map node is generated for the map data. In one example, the map node represents the map image that corresponds and/or is included as part of the map data. In another example, the map node generated at module 804 replaces an already existing map node. For example, if a map node has already been created for the map data or map data that includes a similar map image, then the map node generated at module 804 can replace the already existing map node.

The flowchart continues to module 806, where the map node generated at module 804 is organized into a hierarchy of map nodes. In one example, the map node is organized into the hierarchy beneath at least one organizational node. Further in the one example, the organizational node can represent an entity that is associated with a user. Still further in the one example, the organizational node can represent a building that is within the corresponding map image of the map data for which the map node was generated. In another example, the map node is organized into a hierarchy of map nodes based on the user for which the map data is created. In another example, the map node is organized into a hierarchy of map nodes based on the zoom level of the corresponding map image of the map data.

The flowchart continues to module 808, where a user is provided with functionalities for generating a trace outline in the map image. In one example, the user is presented with a floor cursor tool that allows a user to create a trace outline of a floor in the map image. Further in the one example, the floor cursor tool includes a line drawing tool that allows a user to draw trace lines within the map image to create a trace outline. Still in the one example, the floor cursor tool includes a shape tool that allows a user to create shapes, parts of the sides of which, form at least in part, a trace outline of a floor.

The flowchart continues to module 810, where a trace outline of the floor is received. In one example, the trace outline of the floor is created using the functionalities provided at module 808. In another example, the trace outline of the floor is created in a map image of a satellite or aerial view that includes a 3-D representation of a building that includes the floor for which the trace outline is created.

The flowchart continues to module 812, where floor dimensions are generated from the trace outline of the floor of the building received at module 810. In one example, the floor dimensions are the dimensions of a floor of a building in the physical space. In another example, the floor dimensions include the lengths of the sides of the building that define the footprint of the floor of the building. In another example, the floor dimensions are generated from the trace outline of the floor of the building and the map data of a map image in which the trace outline of the floor was created.

Figure 9:
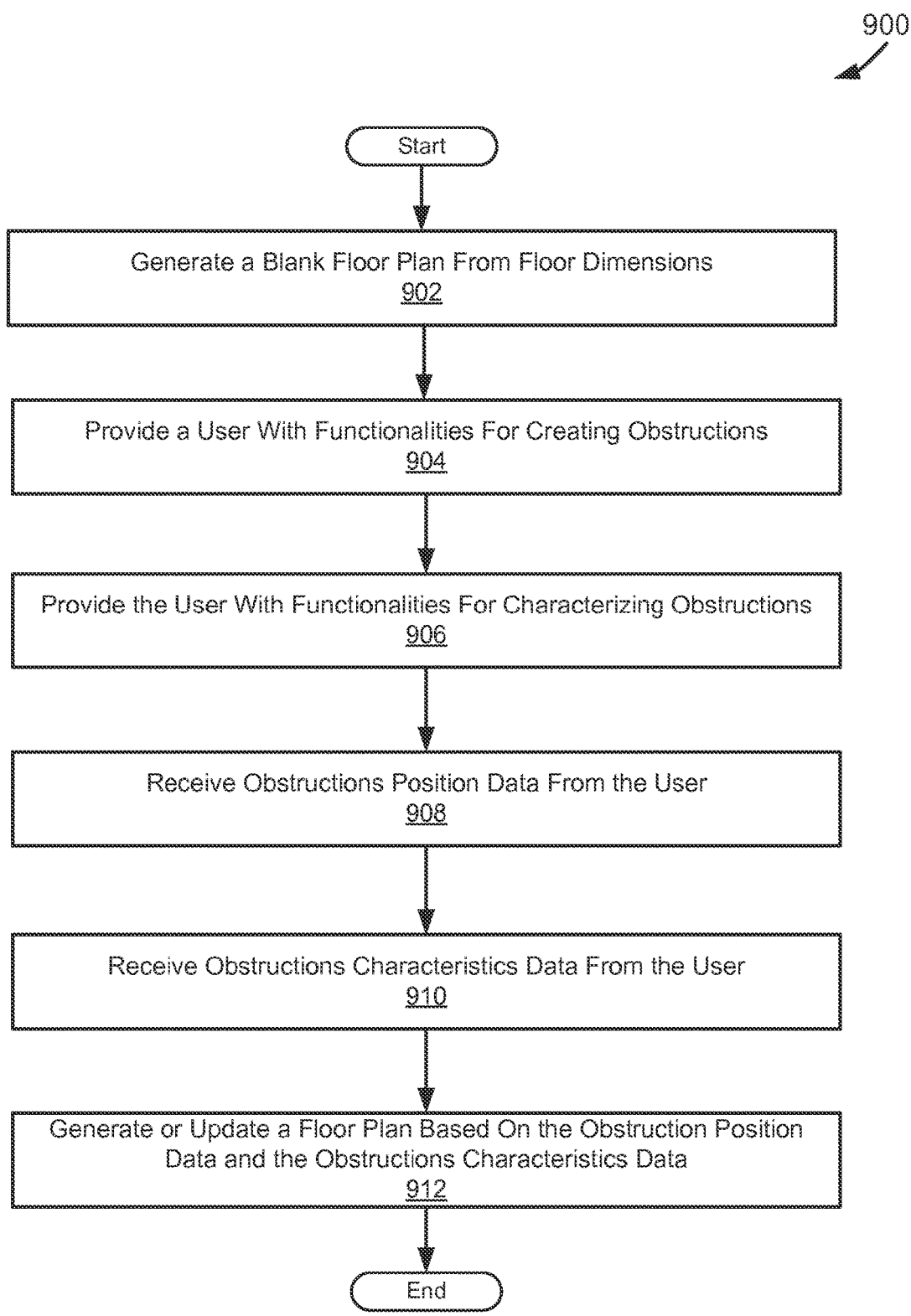
FIG. 9 depicts a diagram of a flowchart of an example of a method for generating and/or updating a floor plan.

FIG. 9 depicts a diagram 900 of a flowchart of an example of a method for generating and/or updating a floor plan. The flowchart begins at module 902, where a blank floor plan is generated from floor dimensions. In one example, a blank floor plan includes only exterior obstructions of the floor. In another example, the exterior obstructions are the exterior walls of the building that define the footprint of the floor and are generated from floor dimensions. In still another example, the floor dimensions are generated, at least in part, from map data of a map image.

The flowchart continues to module 904 where functionalities for creating obstructions are provided to a user. In one example, the functionalities allow a user to create and/or update, at least in part, a floor plan. In another example, the functionalities allow a user to position interior obstructions within a blank floor plan. In still another example, the functionalities include an obstruction cursor tool. In the still another example, the obstruction cursor tool allows a user to position and/or reposition obstructions within a floor plan or a blank floor plan in creating and/or updating a floor plan. In a further example, the positions or repositions of obstructions that are provided for by the functionalities are signified by created obstruction position data.

The flowchart continues to module 906 where functionalities for characterizing obstructions are provided to a user. In one example, the functionalities allow a user to create and/or update, at least in part, a floor plan by characterizing obstructions. In another example, characterizing obstructions includes adding the thickness of the obstructions and the materials of which the obstructions are comprised. In another example, characterizing obstructions includes adding the thicknesses of exterior obstructions (including exterior walls) and the materials of which the exterior obstructions are comprised. In still another example, the functionalities include an obstruction characteristics tool that allows a user to characterize obstructions in creating and/or updating a floor plan. In a further example, the characteristics of obstructions, created by the provided functionalities allowing a user to characterize obstructions, are signified by created obstructions characteristics data.

The flowchart continues to module 908, where obstructions position data is received from the user. In one example the obstructions position data specifies the positions of obstructions within a floor plan or a blank floor plan. For example, the obstruction position data can specify the position of cubicles within a floor of a building.

The flowchart continues to module 910, where obstructions characteristics data is received from the user. In one example, the obstructions characteristics data specifies the characteristics of obstructions within a floor plan or a blank floor plan. For example, the obstructions characteristics data can specify the material that the outer walls are comprised of in a blank floor plan.

The flowchart continues to module 912, where a floor plan is generated or updated based on the obstructions position data received at module 908 and the obstructions characteristics data received at module 910. In one example, a blank floor plan is updated to include obstructions at positions specified by the obstructions position data to create, at least in part, a floor plan. In another example, a floor plan is updated to include obstructions at positions specified by the obstructions position data. In yet another example, a blank floor plan is updated to include the characteristics of obstructions specified by the obstructions characteristics data to create, at least in part, a floor plan. In still another example, a floor plan is updated to include the characteristics of obstructions specified by the obstructions characteristics data.

Figure 10:
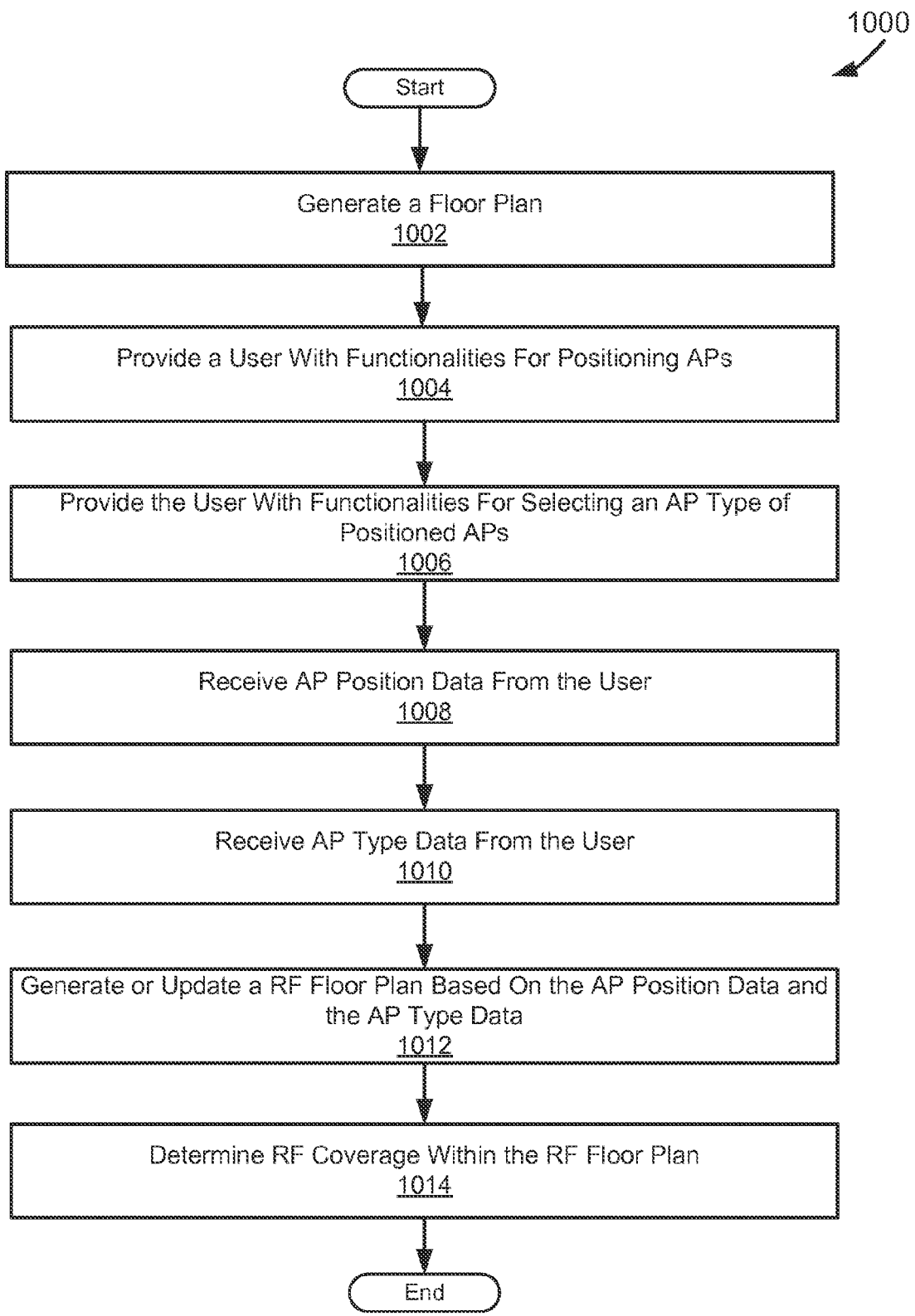
FIG. 10 depicts a diagram of a flowchart of an example of a method for generating and/or updating a RF floor plan.

FIG. 10 depicts a diagram 1000 of a flowchart of an example of a method for generating and/or updating a RF floor plan. The flowchart begins at module 1002, where a floor plan is generated. In one example, the floor plan is generated using floor dimensions determined from map data of a map image. In another example, the floor plan is generated using obstructions position data received from a user. In still another example, the floor plan is generated using obstructions characteristics data received from a user.

The flowchart continues to module 1004, where a user is provided with functionalities for positioning APs. In one example, the functionalities allow the user to position or reposition APs within a floor plan to create a RF floor plan. In another example, the functionalities allow the user to position or reposition APs within an already existing RF floor plan. In still another example, the functionalities include an AP position cursor tool that allows a user to position or reposition APs. In yet another example, the positions or repositions of APs that are provided for by the functionalities for positioning APs are signified by created AP position data.

The flowchart continues to module 1006, where a user is provided with functionalities for selecting a type of AP. In one example, the functionalities allow the user to select the type of AP within a floor plan to create a RF floor plan. In another example, the functionalities allow the user to select or change the type of AP within an already existing RF floor plan. In still another example, the functionalities include an AP type selection tool that allows the user to select or change the type of AP. In yet another example, the selected or changed type of AP that is provided for by the functionalities for selecting a type of AP is signified by AP type data.

The flowchart continues to module 1008, where AP position data is received from the user. In one example the AP position data signifies the positions or repositions of APs. For example, the AP position data can specify that an AP is positioned within the center of a conference room in a floor plan or a RF floor plan.

The flowchart continues to module 1010, where AP type data is received from the user. In one example, the AP type data signifies a selection of a type of an AP within a RF floor plan. For example, the AP type data can signify that a specific AP within a RF floor plan is of AP type A.

The flowchart continues to module 1012, where a RF floor plan is generated or updated based on the AP position data received at module 1008 and the AP type data received at module 1010. In one example, a RF floor plan is generated from a floor plan generated at module 1002. In another example, a RF floor plan is updated from an already existing RF floor plan. In still another example, the floor plan is updated to include an AP of a specific type, according to the AP type data, at a specific position within the floor plan, according to the AP position data, to generate a RF floor plan. In yet another example, an already existing RF floor plan is updated to include an AP of a specific type, according to the AP type data, at a specific position within the floor plan, according to the AP position data.

The flowchart continues to module 1014, where RF coverage within the RF floor plan is determined. In one example, RF coverage is determined based on the positioning of APs and obstructions within the RF floor plan. In another example, RF coverage is determined based on the operational parameters of the APs. In still another example, RF coverage is determined based on signal propagation characteristics of the obstructions, based on the dimensions of the obstructions and the materials of which the obstructions are comprised.

Figure 11:
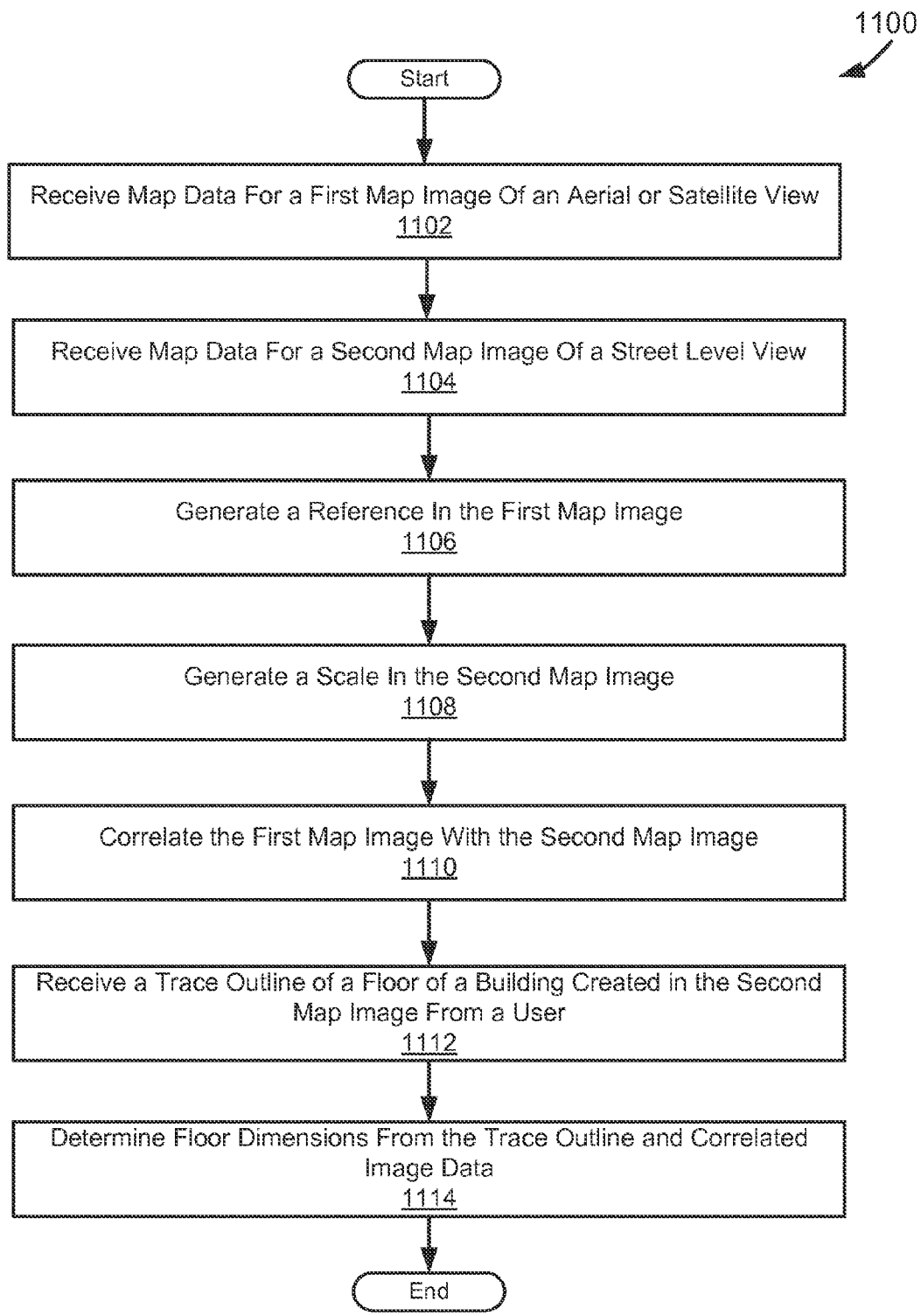
FIG. 11 depicts a diagram of a flowchart of an example of another method for determining floor dimensions from map images.

FIG. 11 depicts a diagram 1100 of a flowchart of an example of another method for determining floor dimensions from map images. The flowchart begins at module 1102, with receiving map data for a first map image of an aerial or satellite view. In one example, the map data for the first map image is received from a map server. In another example, the map image includes a 3-D representation of a building within the map image.

The flowchart continues to module 1104, where map data for a second map image of a street level view is received. In one example, the map data for the second map image is received from a map server. In another example, the map data for the second map image is generated by a user. In still another example, the map data for the second map image is generated by a user of the client device, using the client device, such as taking a photo with a smart phone or a tablet.

The flowchart continues to module 1106, where a reference, signified by reference data, is generated in the first map image. In one example, the reference is generated by a user. In another example, the reference is generated by a user in the first map using an image correlation cursor tool. In still another example, the reference is a line drawn in the first map image. In a further example, the reference is a selected object or feature within the first map image.

The flowchart continues to module 1108, where a scale, signified by scale data, is generated in the second map image. In one example, the scale is generated by a user. In another example, the scale is generated by a user in the second map image using an image correlation cursor tool. In still another example, the scale is a line drawn in the second map image. In a further example, the scale is a selected object or feature within the second map image. In still a further example, the length and/or dimensions in the physical space of the scale in the second map image are the same as the length and/or dimensions in the physical space of the reference in the first map image. In another example, the scale in the second map image is the same as the reference in the first map image.

The flowchart continues to module 1110, where the first map image is correlated with the second map image using the reference data and the scale data. In one example, the length and/or dimensions in the physical space of a reference in the first map image are determined from map data of the first map image. Further in the one example, the length and/or dimensions in the physical space of the reference in the first map image are determined from longitude and latitude coordinates included as part of the map data of the first map image. In another example, the length and/or dimensions in the physical space of a scale in the second map image are determined based on the length and/or dimensions in the physical space of a reference in the first map image, thereby correlating the first and second map images.

The flowchart continues to module 1112, where a trace outline of a floor of a building created in the second map image by a user is received. In one example, the trace outline is generated by a user using a floor cursor tool. In another example, the trace outline includes trace lines that represent the height of the floor for which the trace outline is created. In another example, the trace outline is created using applicable techniques, such as the techniques described in this paper.

The flowchart continues to module 1114, where floor dimensions are determined from the trace outline and correlated image data. In one example, the trace outline is created in the second map image. In another example, the correlated image data includes the length and/or dimensions in the physical space of the scale in the second map image. In yet another example, the floor dimensions of the floor are generated by determining the dimensions of the trace outline created in the second the second map image using the length and/or dimensions in the physical space of the scale in the second map image.

Figure 12:
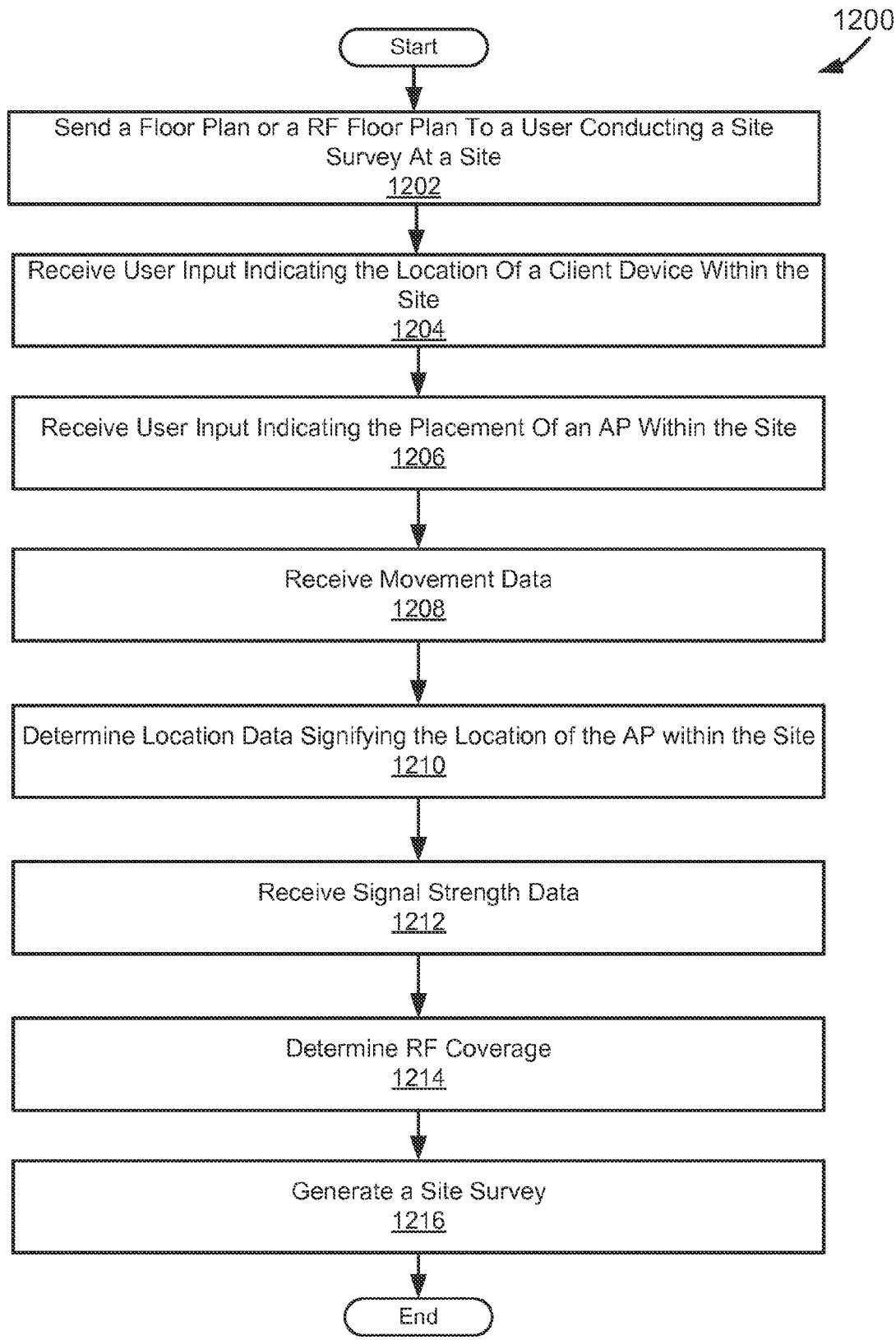
FIG. 12 depicts a diagram of a flowchart of an example of a method for generating a site survey.

FIG. 12 depicts a diagram 1200 of a flowchart of an example of a method for generating a site survey. The flowchart begins at module 1202, where a floor plan or a RF floor plan is sent to a user conducting a site survey at a site. In one example, the floor plan or the RF floor plan is sent to a client device of the user while the user is at the site at which the site survey is conducted. In another example, the user views the floor plan or the RF plan at the site through a graphical user interface that is part of the client device. In still another example, the floor plan or the RF plan, is created, at least in part, using floor dimensions determined from map data of a map image.

The flowchart continues to module 1204, where user input indicating the location of a client device within the site is received. In one example, the user indicates the location of a client device within the site, and a corresponding location in a floor plan or a RF floor plan, by indicating the location of the client device within the floor plan or the RF floor plan received at module 1202, thereby creating the user input indicating the location of the client device within the site. For example, if the client device is located at an entrance to the site, the user input can indicate that the client device is located at the entrance to the site, and the corresponding entrance to the site shown in the floor plan or the RF floor plan. In another example, the location of the client device within the site indicated by the received user input serves as a reference point in calculating the position of the client device and APs within the site, and the corresponding floor plan or RF floor plan.

The flowchart continues to module 1206, where user input indicating the placement of an AP within the site is received. In one example, the user input indicates the location of a client device within the site, the location of the client device corresponding to the placement of an AP within the site. In another example, the user creates user input indicating the placement of an AP within the site by interacting with the client device through a graphical user interface.

The flowchart continues to module 1208, where movement data is received from the client device. In one example, the movement data indicates the amount that the client device has moved or been displaced over a period of time. In another example, the movement data indicates the amount that the client device has moved from the reference point, determined from user input indicating the location of the client device within the site received at module 1204, to a specific point within the site and corresponding floor plan or RF floor plan.

The flowchart continues to module 1210, where location data specifying the location of the AP within the site is determined. In one example, the AP is the AP that the user input, received at module 1208, specified the placement of within the site. In one example, the location data specifying the location of the AP within the site specifies the location of the AP within a floor plan or RF floor plan corresponding to the site. In another example, the location data is determined from the user input received at module 1204 indicating the location of a client device within the site, the user input received at module 1206 indicating the placement of the AP within the site, and the movement data received at module 1208. In still another example, the location data specifying the location of the AP within the site is generated by determining the amount that the client device moves or is displaced, using the movement data, from the reference point and the position of client device corresponding to the placement of the AP within the site.

The flowchart continues to module 1212, where signal strength data is received. In one example, the signal strength data is received from the client device. In another example, the signal strength data is received from the client device using an EMF detector that is coupled to or included as part of the client device. In still another example, the signal strength data represents RF signal strength at various points within the site.

The flowchart continues to module 1214, where RF coverage is determined. In one example, RF coverage is determined, at least in part, based on location data generated at module 1210, specifying the location of an AP within the site, and corresponding floor plan or RF floor plan. In another example, RF coverage is determined, at least in part, based on signal strength data received at module 1212 and location data, indicating the position of a client device in the site where the signal strength was measured in order to generate the signal strength data. In still another example, RF coverage is determined, at least in part, based on input received from the user regarding operational parameters of an AP within the site.

The flowchart continues to module 1216, where a site survey is generated. In one example, the site survey is generated based, at least in part, on RF coverage determined at module 1214. In another example, the site survey is generated based, at least in part, on location data, generated at module 1210, signifying the location of an AP within the site, and a corresponding floor plan or RF floor plan. In still another example, the site survey includes coverage levels at various points within the site, and corresponding floor plan or RF floor plan. In a further example, the coverage levels at various points within site are represented as a heat map within a floor plan or a RF floor plan.

Figure 13:
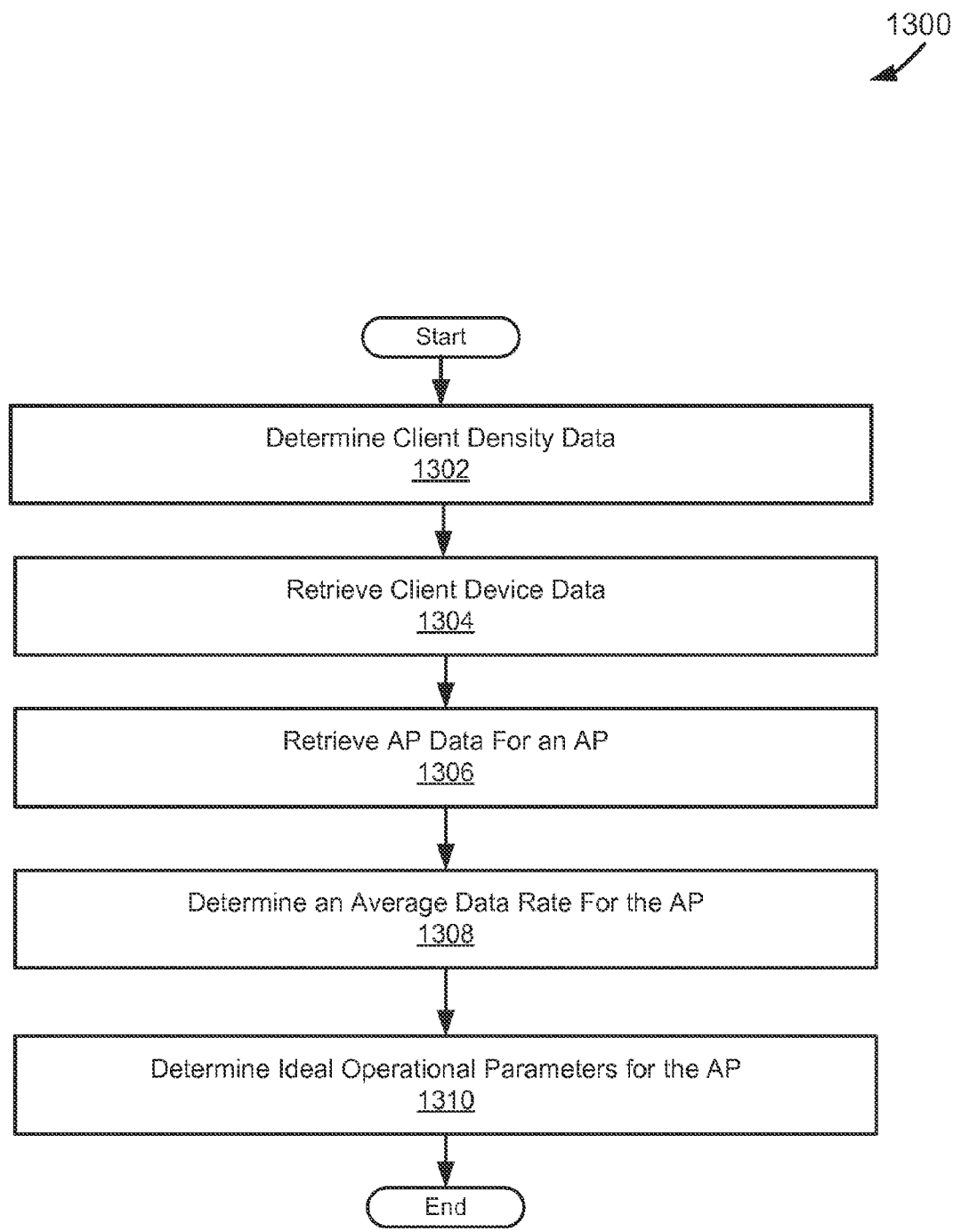
FIG. 13 depicts a diagram of a flowchart of an example of a method for generating determining ideal operational parameters for an AP.

FIG. 13 depicts a diagram 1300 of a flowchart of an example of a method for generating determining ideal operational parameters for an AP. The flowchart begins at module 1302, with determining client density data. In one example the client density data indicates the number of client devices that connect to an AP at a given time. In another example, the client density data is determined by averaging the number of clients that are coupled to the AP over a period of time. In still another example, the client density data is determined based on a client density number determined by a user. In yet another example, the client density data includes the types of devices that are usually connected to the AP.

The flowchart continues to module 1304, where client device data is retrieved. In one example, the client device data includes the operational parameters of various types of client devices. In another example, the client device data specifies the type of client device, e.g. a smart phone, a laptop, or a tablet.

The flowchart continues to module 1306, where AP data for an AP is retrieved. In one example the AP data is for the AP that the client density data was determined for at module 1302. In another example the AP data includes the operational parameters of the AP.

The flowchart continues to module 1308, where an average data rate is determined for the AP. In one example, the average data rate is determined from, at least in part, the client density data determined at module 1302. In another example, the average data rate is determined from, at least in part, the client device data stored in the client device datastore. For example if the client device data indicates the average number of client devices that are connected to an AP and the specific types of client devices that are connected to an AP, and the client device data indicates the amount of wireless bandwidth the client devices of the specific types use, then the average data rate for the AP is determined.

The flowchart continues to module 1310, where ideal operational parameters are determined for the AP. In one example, the ideal operational parameters are determined based on the average data rate for the AP determined at module 1308. In another example, the ideal operational parameters are determined based on the average data rate for the AP and AP data retrieved at module 1306. For example, if the AP data indicates the operating powers of the AP, the ideal operational parameters can include the operating powers necessary to achieve the average data rate determined at module 1308.

These and other examples provided in this paper are intended to illustrate but not necessarily to limit the described implementation. As used herein, the term "implementation" means an implementation that serves to illustrate by way of example but not limitation. The techniques described in the preceding text and figures can be mixed and matched as circumstances demand to produce alternative implementations.

We claim:

1. A method comprising:

receiving map data for a plurality of map images of an aerial or satellite view, each of the plurality of map images corresponding to a different zoom level of a specific location of the aerial or satellite view, the map data including the plurality of map images at the corresponding different zoom levels, the plurality of map images being dynamically generated as a user zooms in on the specific location of the aerial or satellite view;

providing a user with functionalities for generating a respective trace outline in each of the plurality of map images;

receiving a respective trace outline of a floor of a building in the plurality of map images, the respective trace outlines of the floor of the building in the plurality of map images generated by the user;

determining floor dimensions of the floor of the building from the respective trace outlines of the floor of the building in the plurality of map images and the corresponding different zoom levels of the plurality of map images, and by using a nesting function, the nesting function specifying one or more multi-dimensional nested shapes included in a multi-dimensional outer shape formed by at least one of the respective trace outlines, an area of the one or more multi-dimensional nested shapes being subtracted from an area of the multi-dimensional outer shape in determining the floor dimensions;

generating a blank floor plan using the floor dimensions based on the plurality of map images of the aerial or satellite view, wherein the blank floor plan is used in planning positioning of access points in the building;

generating a floor plan from the blank floor plan;

providing the user with functionalities for positioning access points within the floor plan;
providing the user with functionalities for selecting an access point type of access points positioned;
receiving access point position data from the user;
receiving access point type data from the user;
generating an RF floor plan based on the floor plan, the access point position data, and the access point type data;
determining client density data with respect to a specific access point of the access points in the building;
receiving client device data of client devices coupled to the specific access point;
receiving access point operational parameter data of the specific access point;
determining an average data rate for the specific access point based on the client density data and the client device data;
determining, as part of the RF floor plan, ideal operational parameters of the specific access point according to the average data rate and an amount of interference with the other of the access points in the RF floor plan;
operating the specific access point according to the determined ideal operational parameters.

2. The method of claim 1, further comprising:
providing the user with functionalities for creating obstructions in the blank floor plan;
providing the user with functionalities for characterizing the obstructions in the blank floor plan;
receiving obstructions position data from the user;
receiving obstructions characteristics data from the user;
wherein the floor plan is generated also based on the obstructions position data and the obstructions characteristics data.

3. The method of claim 1, further comprising determining RF coverage within the RF floor plan.

4. A method comprising:
receiving first map data for a first map image of an aerial or satellite view of a building, the first map data including a zoom level of the first map image;
receiving second map data for a second map image of a street level view of the building;
receiving reference data signifying a reference created in the first map image;
receiving scale data signifying a scale created in the second map image;
correlating the first map image with the second map image using the reference data and the scale data to generate correlated image data including dimensions of the scale in a physical space;
providing a user with functionalities for generating a trace outline in the second map image;
receiving a trace outline of a floor of the building in the second map image generated by the user;
determining floor dimensions of the floor of the building from the correlated image data, the trace outline of the floor of the building in the second map image, a nesting function specifying one or more multi-dimensional nested shapes included in a multi-dimensional outer shape formed by the trace outline of the floor of the building in the second map image, and the zoom level, wherein an area of the one or more multi-dimensional nested shapes is subtracted from an area of the multi-dimensional outer shape in determining the floor dimensions;
generating a blank floor plan using the floor dimensions, wherein the blank floor plan is used in planning positioning of access points in the building;
generating a floor plan from the blank floor plan;
providing the user with functionalities for positioning access points within the floor plan;
providing the user with functionalities for selecting an access point type of access points positioned;
receiving access point position data from the user;
receiving access point type data from the user;
generating an RF floor plan based on the floor plan, the access point position data, and the access point type data;
determining client density data with respect to a specific access point of the access points in the building;
receiving client device data of client devices coupled to the specific access point;
receiving access point operational parameter data of the specific access point;
determining an average data rate for the specific access point based on the client density data and the client device data;
determining, as part of the RF floor plan, ideal operational parameters of the specific access point according to the average data rate and an amount of interference with the other of the access points in the RF floor plan;
operating the specific access point according to the determined ideal operational parameters.

5. The method of claim 4, further comprising:
providing the user with functionalities for creating obstructions in the blank floor plan;
providing the user with functionalities for characterizing the obstructions in the blank floor plan;
receiving obstructions position data from the user;
receiving obstructions characteristics data from the user;
wherein the floor plan is generated also based on the obstructions position data and the obstructions characteristics data.

6. The method of claim 4, further comprising determining RF coverage within the RF floor plan.

7. The method of claim 4, wherein the floor dimensions include a height of the floor of the building.

* * * * *